(12) United States Patent
Takemori et al.

(10) Patent No.: US 6,809,375 B2
(45) Date of Patent: Oct. 26, 2004

(54) SEMICONDUCTOR DEVICE HAVING SHALLOW TRENCHES AND METHOD FOR MANUFACTURING THE SAME

(75) Inventors: Toshiyuki Takemori, Hanno (JP); Masato Itoi, Hanno (JP); Yuji Watanabe, Hanno (JP)

(73) Assignee: Shindengen Electric Manufacturing Co., Ltd. (JP)

( * ) Notice: Subject to any disclaimer, the term of this patent is extended or adjusted under 35 U.S.C. 154(b) by 0 days.

(21) Appl. No.: 10/112,056

(22) Filed: Apr. 1, 2002

(65) Prior Publication Data

US 2002/0153558 A1 Oct. 24, 2002

(30) Foreign Application Priority Data

Apr. 2, 2001 (JP) .......................................... 2001-103197

(51) Int. Cl.[7] .......................... H01L 29/76; H01L 29/94; H01L 31/062; H01L 31/113
(52) U.S. Cl. ........................ 257/330; 257/329; 257/331; 257/341
(58) Field of Search ................................. 257/330, 331, 257/329, 341, 495, 328

(56) References Cited

U.S. PATENT DOCUMENTS

| | | | |
|---|---|---|---|
| 5,689,121 A | | 11/1997 | Kitagawa et al. |
| 5,770,878 A | | 6/1998 | Beasom |
| 6,191,447 B1 | * | 2/2001 | Baliga .......................... 257/330 |
| 6,198,127 B1 | * | 3/2001 | Kocon .......................... 257/328 |
| 6,236,099 B1 | * | 5/2001 | Boden, Jr. ................... 257/495 |
| 6,518,127 B2 | * | 2/2003 | Hshieh et al. .............. 257/330 |
| 6,674,124 B2 | * | 1/2004 | Hshieh et al. .............. 257/330 |

* cited by examiner

*Primary Examiner*—Steven Loke
(74) *Attorney, Agent, or Firm*—Lowe Hauptman Gilman & Berner, LLP

(57) ABSTRACT

The capacitance between the gate electrode film and the drain layer of semiconductor device is reduced while keeping the resistance low, with the withstand voltage of the gate insulating film also being maintained at a sufficient level. A trench 10 is formed with the bottom of the trench at a comparatively shallow position in an N-epitaxial layer 18. The thickness of a bottom surface part 16 of a gate electrode film 11 is formed so as to be thicker than other parts of the gate electrode film 11. Also, when a P type body layer 19 is formed, an interface between the P type body layer 19 and an N-epitaxial layer 18 is located at a deeper position than a bottom end of the gate electrode film 11.

12 Claims, 28 Drawing Sheets

SEMICONDUCTOR DEVICE HAVING SHALLOW TRENCHES AND METHOD FOR MANUFACTURING THE SAME

BACKGROUND OF THE INVENTION

1. Field of the Invention

The present invention relates to a semiconductor device and a method of manufacturing the same. In particular, the present invention relates to a semiconductor device with a trench gate power MOSFET construction that is used in a power supply circuit or the like, and to a method of manufacturing the same.

2. Background Art

Trench gate power MOSFETs have been widely used in recent years in a variety of power supply apparatuses, such as DC—DC converters. FIGS. 51A and 51B show one example of a semiconductor device that has a trench gate power MOSFET construction according to the background art, with FIG. 51A being an overhead view of the semiconductor device and FIG. 51B being a cross-sectional view taken along the line A—A in FIG. 51A. In these drawings, numerals 100a to 100e are cells, numeral 110 is a trench, numeral 111 is a gate electrode film, numeral 117 is an N+ type silicon substrate, numeral 118 is an N− epitaxial layer, numeral 119 is a P type body layer, numeral 120 is a P+type dispersion region, numeral 121 is an N+type source region, numeral 122 is an interlayer dielectric, numeral 124 is a source electrode film, numeral 125 is a drain electrode film, numeral 127 is a gate insulating film, and numeral 141 is an upper insulating film.

As shown by the cells 100a to 100e in FIG. 51A, the present semiconductor device is formed with a large number of cells that are arranged in a hound's-tooth check-like pattern on the surface of the semiconductor device. As shown by cell 100a, for example, each cell is formed with an N+type source region 121 surrounding a P+type dispersion region.

As shown in FIG. 51B, the cross-sectional form of the present semiconductor device is such that an N− epitaxial layer 118 is formed on top of an N+ type silicon substrate 117, with a P type body layer 119 being formed on top of the N− epitaxial layer 118. P+type dispersion regions 120 and N+type source regions 121 are formed in this P type body layer 119. Trenches 110 that pass through the P type body layer 119 and are deep enough to reach into the N− epitaxial layer 118 are also formed between the cells 100a to 100e.

The trenches 110 provide an opening to the P type body layer 119 and reach into the N− epitaxial layer 118. A gate insulating film 127 is formed on the side surfaces and bottom surfaces of these trenches 110, with a gate electrode film 111 being formed in the spaces surrounded by the gate insulating film 127. An upper insulating film 141 is formed on top of the gate insulating film 127 and the gate electrode film 111. An interlayer dielectric 122 is also formed on top of the upper insulating film 141 and parts of the N+type source region 121.

A source electrode film 124 is formed on top of the P+type dispersion region 120, the N+ type source region 121, and the interlayer dielectric 122. A drain electrode film 125 is also formed on the other surface of the N+ type silicon substrate 117.

In a semiconductor device of the above construction, when a voltage is applied between the source electrode film 124 and the drain electrode film 125 and a voltage that is equal to or greater than a predetermined threshold voltage is simultaneously applied between the gate electrode film 111 and the source electrode film 124, an inversion layer is formed in the P type body layer 119 in a boundary region adjacent to the gate insulating film 127, thereby creating a channel. As a result, an electric current flows through this channel from the drain electrode film 125 to the source electrode film 124.

On the other hand, with a semiconductor device of the above construction, the trenches 110 have to be deeply formed in order to make the bottom parts of the gate insulating film 127 thicker than the other parts and so ensure that a suitable withstand voltage is achieved for the gate insulating film 127. For this purpose, as shown in FIG. 51B, the trenches 110 are produced with a large depth D so as to provide sufficient space for making the bottom parts of the gate insulating film 127 thick. If the trenches 110 are deeply formed, an increase can be made in the area of the outer surface of the gate insulating film 127, making it possible to reduce the On resistance $R_{on}$.

However, when the area of the outer surface of the gate insulating film 127 is increased, this also results in an increase in the capacitance $C_{rss}$ between the gate electrode film 111 and the N− epitaxial layer 118, which worsens the switching characteristics of the semiconductor device. Also, increasing the depth D can lead to problems such as an electrical field being concentrated at a specific part of the gate insulating film 127 when a voltage is applied between the source electrode film 124 and the drain electrode film 125.

SUMMARY OF THE INVENTION

To solve the problems mentioned above, the present invention has an object of providing a semiconductor device for which the capacitance between the gate electrode film and the drain layer can be reduced while keeping the On resistance low and the withstand voltage of the gate insulating film at a sufficient level.

To achieve the stated object, the present invention is a semiconductor device, including: a semiconductor substrate, in which a drain layer of a first conductivity type and a conductive region of an opposite conductivity-type to the first conductivity type are formed with the conductive region over the drain layer; a trench formed as an opening in the conductive region that reaches the drain layer; a source region of the first conductivity type that is positioned inside the conductive region, with at least part of the source region being exposed to inner surfaces of the trench; a gate insulating film that is formed on the inner surfaces of the trench so that an upper surface of the gate insulating film at a bottom of the trench is deeper than the source region but is shallower than an interface between the drain layer and the conductive region; a gate electrode film that is formed on inner surfaces of the gate insulating film; and a source electrode film that is insulated from the gate electrode film and is connected to the source region.

As a result, in the semiconductor device of the present invention, the gate electrode film is formed at a shallower position than the interface between the drain layer and the conductive region, so that even if trenches are made shallower than in the background art, the bottom part of the gate insulating film can still be made about as thick as in the background art. Also, as a reduction can be made in the surface area of the outer surfaces of the gate electrode film, the capacitance can be reduced. Also, since the bottom part of the gate insulating film can be made thick even when the trenches are shallower than in the background art, it is possible to avoid problems, such as a concentration of an electric field at a specific part of the gate insulating film, that occur when the trenches are formed deeper than the drain layer. It should be noted that the gate electrode film should be preferably formed with a depth that is sufficient and results in the On resistance being low.

The present invention is also a semiconductor device, including: a semiconductor substrate, in which a drain layer of a first conductivity type and a conductive region of an opposite conductivity-type to the first conductivity type are formed with the conductive region being positioned over the drain layer; a trench formed as an opening in the conductive region that reaches the drain layer; a source region of the first conductivity type that is positioned inside the conductive region, with at least part of the source region being exposed to inner surfaces of the trench; a gate insulating film that is formed on the inner surfaces of the trench so that parts of the gate insulating film that are located beyond a predetermined depth are thicker than other parts of the gate insulating film; a gate electrode film that is formed on inner surfaces of the gate insulating film; and a source electrode film that is insulated from the gate electrode film and is connected to the source region.

With the semiconductor device of the present invention, parts of the gate electrode film that are located beyond a predetermined depth are thinner than other parts of the gate insulating film, which is to say, the parts of the gate electrode film that are shallower than the predetermined depth. As a result, the capacitance of the periphery of the deep part of the gate electrode film can be suppressed and the On resistance can be reduced by a certain amount.

The predetermined depth may be in a range that is deeper than the source region but is shallower than an interface between the drain layer and the conductive region.

The present invention is also a semiconductor device, comprising: a semiconductor substrate, in which a drain layer of a first conductivity type, and a conductive region of an opposite conductivity-type to the first conductivity type are formed with the conductive region being positioned over the drain layer; a trench formed as an opening in the conductive region that reaches the drain layer; a source region of the first conductivity type that is positioned inside the conductive region, with at least part of the source region being exposed to inner surfaces of the trench; a gate insulating film that is formed on the inner surfaces of the trench, the gate insulating film being formed so that a thickness of the gate insulating film decreases towards the opening in the conductive region; a gate electrode film that is formed on inner surfaces of the gate insulating film; and a source electrode film that is insulated from the gate electrode film and is connected to the source region.

With the semiconductor device of the present invention the gate electrode film is formed so that a part located beyond a predetermined depth is thinner than other parts, which is to say, the parts that are shallower than the predetermined depth. As a result, the capacitance of the periphery of the deep part of the gate electrode film can be suppressed and the On resistance can be reduced by a certain amount.

Further, a method of manufacturing a semiconductor device comprises the steps of forming a first silicon oxide film on a surface of a semiconductor substrate on which a drain layer of a first conductivity-type has been formed, forming an opening at a predetermined position in the silicon oxide film to expose the drain layer, forming an opening in the exposed drain layer to form a trench in the drain layer, forming a second silicon oxide film on the surface of the semiconductor substrate and inner surfaces of the trench, removing the second silicon oxide film from the surface of the semiconductor substrate and inner surfaces of the trench, so as to let the second silicon oxide film remain up to a predetermined depth in the bottom part of the trench, forming a third silicon oxide film on inner surfaces of the trench by oxidizing the surface of the semiconductor substrate in the area of the trench, depositing a polysilicon film on the surface of the semiconductor substrate and the inner surfaces of the trench, so as to fill up the trench, removing the polysilicon film from the surface of the semiconductor substrate and part of the trench, removing the third silicon oxide film from the surface of the semiconductor substrate and part of the inner surfaces of the trench; and forming a fourth silicon oxide on the surface of the semiconductor substrate and the inner surfaces of the trench.

Accordingly, because the trench is filled up by depositing a polysilicon film after carrying out thermal oxidation with the second silicon oxide film remaining up to a predetermined depth in the bottom part of the trench, a gate electrode can be easily obtained that is shallower than the surface between a drain layer and the conductive region. Therefore, while forming a trench shallower than prior art trenches, a film thickness of the bottom surface of the gate insulating film as thick or thicker than the prior art film thicknesses can be achieved. Further, as the surface area of the outer surfaces of the gate electrode film can be kept small, the capacitance can be reduced. Furthermore, problems such as an electrical field being concentrated at a specific part of the gate electrode film can be resolved because while forming the trench shallower than prior art trenches, the thickness of the bottom part of the gate electrode can be made thick, and therefore the trench can be formed deeper than the drain layer.

Also, a method of manufacturing a semiconductor device, comprising the steps of: forming a first silicon oxide film on a surface of a semiconductor substrate on which a drain layer of a first conductivity-type has been formed; forming an opening at a predetermined position in the silicon oxide film to expose the drain layer; forming an opening in the exposed drain layer to form a first trench in the drain layer; forming a second silicon oxide film on the surface of the semiconductor substrate and inner surfaces of the first trench; forming a silicon nitride film that covers the surface of the semiconductor substrate and the inner surfaces of the first trench; removing the silicon nitride film from the surface of the semiconductor substrate and a bottom surface of the first trench, so as to expose the second silicon oxide film at the surface of the semiconductor substrate and at the bottom surface of the first trench; removing at least part of the first silicon oxide layer and the second silicon oxide layer, as well as the silicon oxide layer exposed at the bottom surface of the first trench, so as to expose the drain layer at the bottom surface of the first trench; forming a second trench by forming an opening in the drain layer exposed at the bottom surface of the first trench; oxidizing the drain layer in a periphery of the second trench; removing a second silicon oxide film and the silicon nitride film from inner side surfaces of the first trench; forming a third silicon oxide film on inner surfaces of the first trench and the second trench and on the surface of the semiconductor substrate; depositing a polysilicon film on the inner surfaces of the first trench and the second trench and the surface of the semiconductor substrate, so as to fill up the first trench and the second trench; removing the polysilicon film from the surface of the semiconductor substrate and part of the first trench; removing the third silicon oxide film from the surface of the semiconductor substrate and part of the inner surfaces of the first trench; and forming a fourth silicon oxide on the surface of the semiconductor substrate and the inner surfaces of the first trench.

As a result, a second trench can be formed in a bottom part of the first trench, thereby making it possible to form a gate electrode film with upper parts and lower parts of different thicknesses.

DESCRIPTION OF THE PREFERRED EMBODIMENTS (First Embodiment)

Figure 1A:
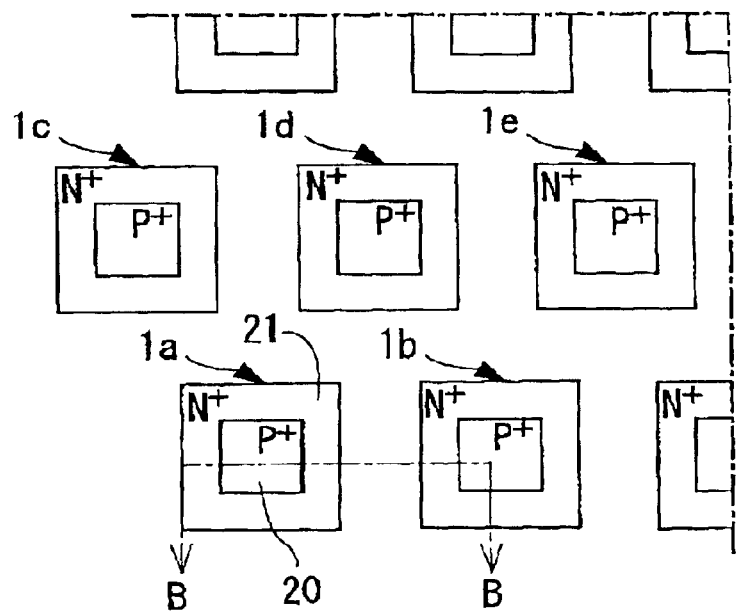
FIGS. 1A and 1B show a semiconductor device according to the first embodiment of the present invention, with FIG. 1A being an overhead view showing the arrangement of cells in the semiconductor device and FIG. 1B being a cross-sectional view taken along the line B—B.
Figure 1B:
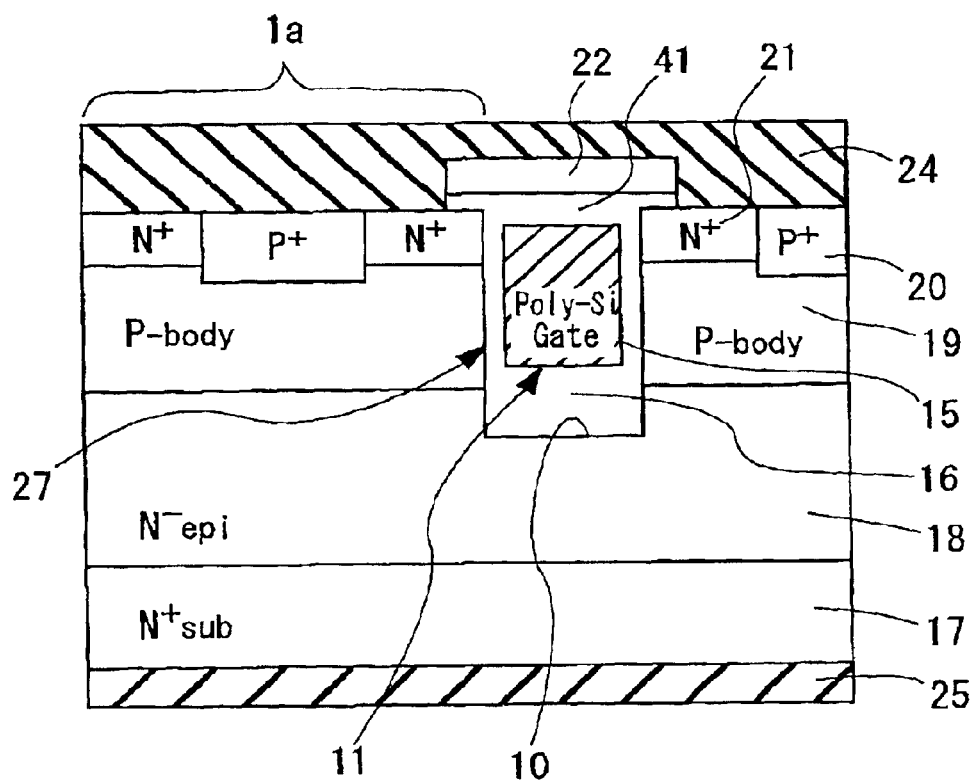

The following is a detailed description, with reference to the attached drawings, of a semiconductor device that is a first embodiment of the present invention. FIGS. 1A and 1B show a semiconductor device of this first embodiment of the present invention, with FIG. 1A being an overhead view showing the arrangement of the cells of the semiconductor device and FIG. 1B being a cross-sectional view taken along the line B—B in FIG. 1A. In these drawings, numerals $1a$ to $1e$ are cells, numeral 10 is a trench, numeral 11 is a gate electrode film, numeral 15 is a side surface part, numeral 16 is a bottom surface part, numeral 17 is an $N^+$ type silicon substrate, numeral 18 is an $N^-$ epitaxial layer, numeral 19 is a P type body layer, numeral 20 is a $P^+$type dispersion region, numeral 21 is an $N^+$type source region, numeral 22 is an interlayer dielectric, numeral 24 is a source electrode film, numeral 25 is a drain electrode film, numeral 27 is a gate insulating film, and numeral 41 is an upper insulating film.

Figure 2:
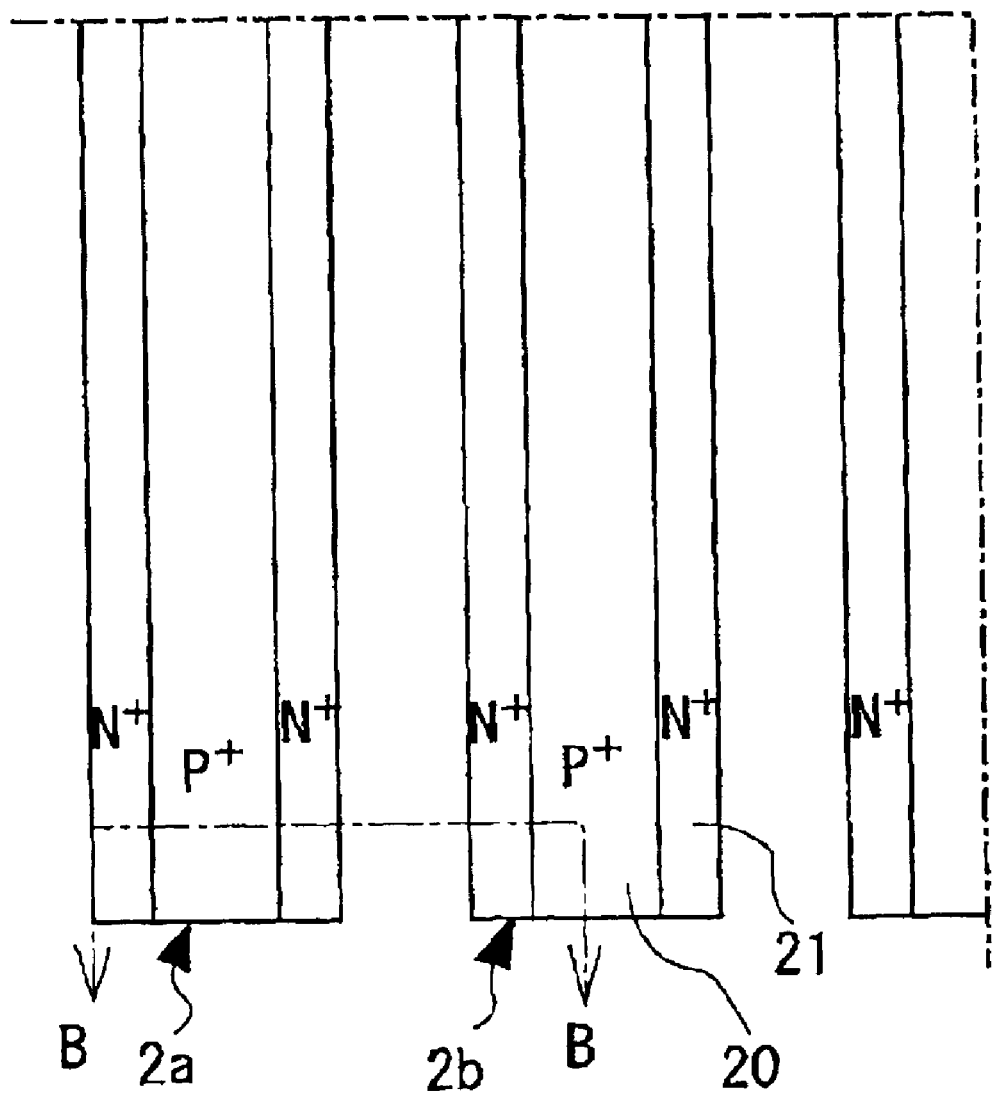
FIG. 2 is an overhead view showing another example arrangement of the cells.

As shown in FIG. 1A, the semiconductor device of this first embodiment of the present invention is constructed with a plurality of cells, such as cells $1a$ to $1e$, that are arranged on the surface of the semiconductor device in a hound's-tooth check-like pattern. As shown by cell $1a$, for example, each cell is formed with an $N^+$type source region 21 surrounding a $P^+$type diffusion region 20. It should be noted that the arrangement of the cells $1a$ to $1e$ is not restricted to the pattern shown in FIG. 1A, with one example of an alternative arrangement being shown in FIG. 2. FIG. 2 is an overhead view of one example of an alternative arrangement of cells. In the illustrated example, each cell, such as cells $2a$ and $2b$, is formed with a $P^+$type diffusion region 20 and $N^+$type source region 21 in the form of thin strips that are arranged in parallel. In the present embodiment, the cells can be formed in other shapes, such as circles, and can be arranged in other patterns, such as a grid.

As shown in FIG. 1B, the cross-sectional form of the present semiconductor device is such that an $N^-$ epitaxial layer 18 is formed on top of an $N^+$ type silicon substrate 17, with a P type body layer 19 being formed on top of the $N^-$ epitaxial layer 18. The cell $1a$ is produced with a $P^+$type dispersion region 20 and an $N^+$type source region 21 being formed in this P type body layer 19.

Trenches 10 that pass through the P type body layer 19 and are deep enough to reach a relatively shallow point inside the $N^-$ epitaxial layer 18 are formed. A gate insulating film 27 is formed so as to be tightly attached to the side surfaces and bottom surfaces of these trenches 10. This gate insulating film 27 is formed so that its bottom surface parts 16 are thicker than its side surface parts 15. The interface between the bottom surface parts 16 of the gate insulating film 27 and the gate electrode 11, that is to say the inner and bottom surfaces of the gate insulation film, is also formed so as to reach a shallower position in the trenches than an interface between the $N^-$ epitaxial layer 18 and the P type body layer 19. A gate electrode film 11 is also formed through deposition in the internal spaces inside the gate insulating film 27 so as to fill these internal spaces. As a result, the gate electrode film 11 is formed so as to reach positions in the trenches 10 that are shallower than the interface between the $N^-$ epitaxial layer 18 and the P type body layer 19. An upper insulating film 41 is also formed on top of this gate electrode film 11.

An interlayer dielectric 22 is also formed on top of the gate insulating film 27. A source electrode film 24 is formed on top of the $P^+$type dispersion region 20, the $N^+$ type source region 21, and the interlayer dielectric 22. A drain electrode film 25 is also formed on the other surface of the $N^+$ type silicon substrate 17.

In the present semiconductor device, when a voltage is applied between the source electrode film 24 and the drain electrode film 25 and a voltage that is equal to or greater than a threshold voltage is simultaneously applied between the gate electrode film 11 and the source electrode film 24, an inversion layer is formed in the P type body layer 19 in a boundary region adjacent to the gate insulating film 27, thereby creating a channel. As a result, an electric current flows through this channel from the drain electrode film 25 to the source electrode film 24. Also, when the voltage that is applied between the gate electrode film 11 and the source electrode film 24 falls below the predetermined threshold voltage, the inversion layer disappears, so that an electric current stops flowing between the drain electrode film 25 and the source electrode film 24.

In the semiconductor device of this first embodiment of the present invention, the gate electrode film 11 is located so as to be shallower than the interface between the $N^-$ epitaxial layer 18 and the P type body layer 19, or in other words, the lower tip of the gate electrode film 11 is positioned above the interface between the N⁻ epitaxial layer 18 and the P type body layer 19. As a result, even if the trenches 10 are formed so as to reach a relatively shallow position in the N⁻ epitaxial layer 18, it is still possible to make the bottom surface parts 16 of the gate insulating film 27 thick enough to ensure that the withstand voltage of the gate insulating film 27 is sufficiently high. Since the trenches 10 are not deeply formed, problems such as the concentration of an electric field at a specific part of the gate insulating film 27 can be avoided.

Figure 3:
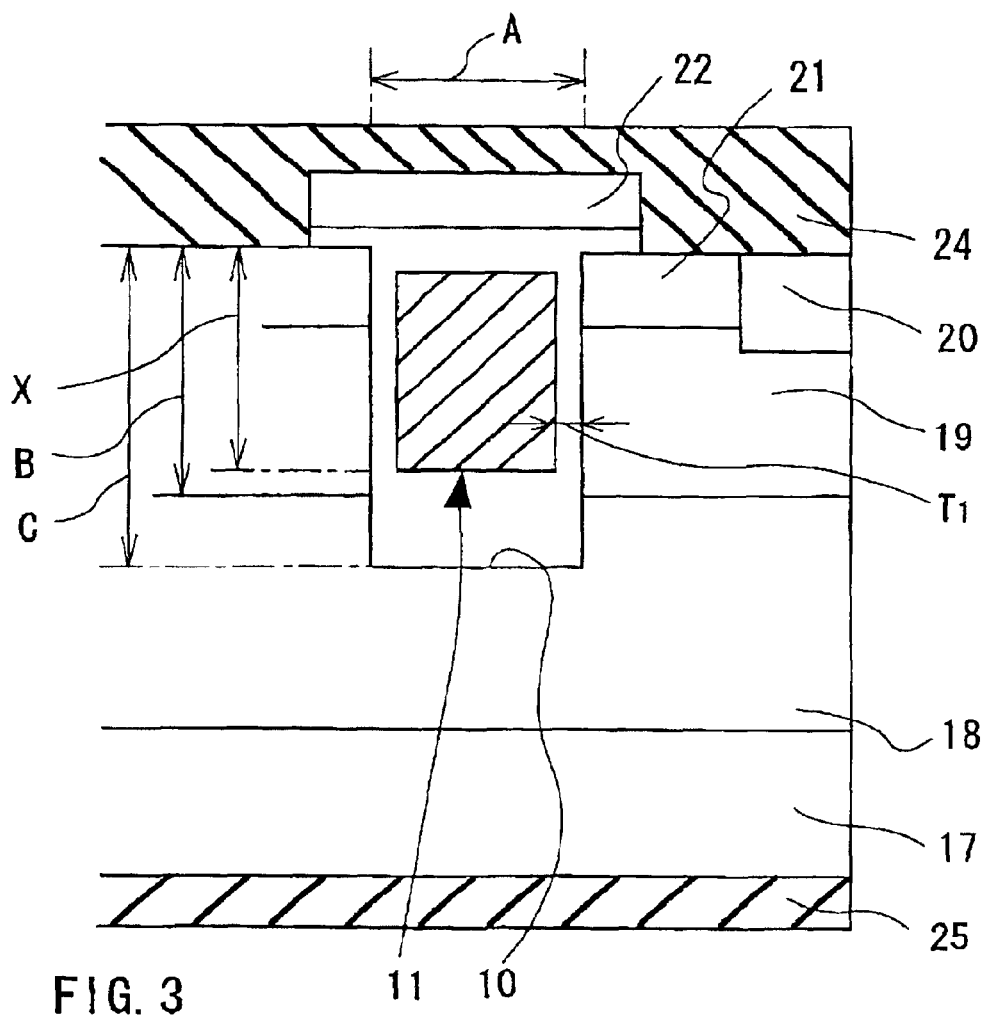
FIG. 3 shows an experimental example of a semiconductor device according to the first embodiment of the present invention.

Also, even if the lower tip of the gate electrode film 11 is positioned above the interface between the N⁻ epitaxial layer 18 and the P type body layer 19, a sufficient reduction in the On resistance $R_{on}$ can be achieved. FIG. 3 shows an experimental example of a semiconductor device according to the first embodiment of the present invention. In FIG. 3, the variable A represents the width of the trenches 10, the variable B represents the thickness of the P type body layer 19, the variable C represents the depth of the trenches 10, the variable $T_1$ represents the thickness of the side surface parts 15 of the gate insulating film 27, and the variable X represents the distance from the surface of the semiconductor device to the lower tip of the gate electrode film 11. It should be noted that the other numerals used in FIG. 3 denote the same parts as in FIG. 1A and FIG. 1B. In the experimental example shown in FIG. 2, the variable A was set at 0.8 μm, the variable B was set at 1.3 μm, the variable C was set at 1.6 μm, and the variable $T_1$ was set at 50 nm. When the On resistance $R_{on}$ was measured, a voltage of 10 V was applied between the source electrode film 24 and the drain electrode film 25 and a voltage of 10 V was simultaneously applied between the gate electrode film 11 and the source electrode film 24, while when the capacitance $C_{iss}$ was measured, voltages of 0 V and 10 V were respectively applied.

Figure 4:
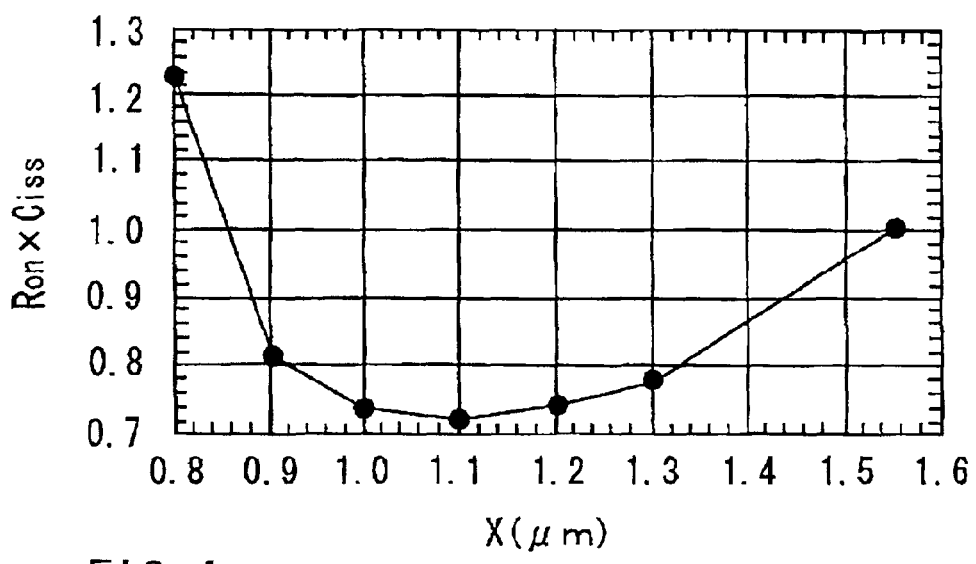
FIG. 4 shows the relationship between the On resistance $R_{on}$ and the capacitance $C_{iss}$ for the experimental example of the semiconductor device according to the first embodiment of the present invention.

FIG. 4 shows the relationship between the On resistance $R_{on}$ and the capacitance $C_{iss}$ for the experimental example of a semiconductor device according to the first embodiment of the present invention. In FIG. 4, the product of the On resistance $R_{on}$ and the capacitance $C_{iss}$ is set at 1.0 for the case where the variable X was 1.55 μm. It should be noted that in the experiments described below, the capacitance $C_{iss}$ not the $C_{rss}$ was measured, though according to the conditions of the experiments, $C_{GS}$ becomes almost constant. If it can be assumed that the relationships $C_{iss}=C_{GS}+C_{GD}$ and $C_{rss}=C_{GD}$ hold, the change in the value $C_{iss}$ with respect to each of the variables X, Y, and Z can be regarded as a change in the value $C_{rss}$, so that $C_{iss}$ was used.

As shown in FIG. 4, in the construction shown in FIG. 3 the product of the $R_{on}$ and the capacitance $C_{iss}$ reached its lowest value when the value X was in a range of around 1.0 μm to 1.2 μm. As a result, it can be said to be advantageous for the depth of the gate electrode film 11 to be in this range, which is to say, for the lower tip of the gate electrode film 11 to be positioned above the boundary face between the N⁻ epitaxial layer 18 and the P type body layer 19.

The following describes the manufacturing process for a semiconductor device according to the first embodiment of the present invention. FIGS. 5 to 21 are a series (a) to (q) of cross-sectional drawings that illustrate the manufacturing process for a semiconductor device according to the first embodiment of the present invention. In these drawings, the numerals 31, 41, 51 and 52 are silicon oxide films, numerals 32 and 45 are photoresist films, numerals 33 and 34 are openings, numeral 10 is a trench and numeral 43 is a polysilicon film.

Figure 5:
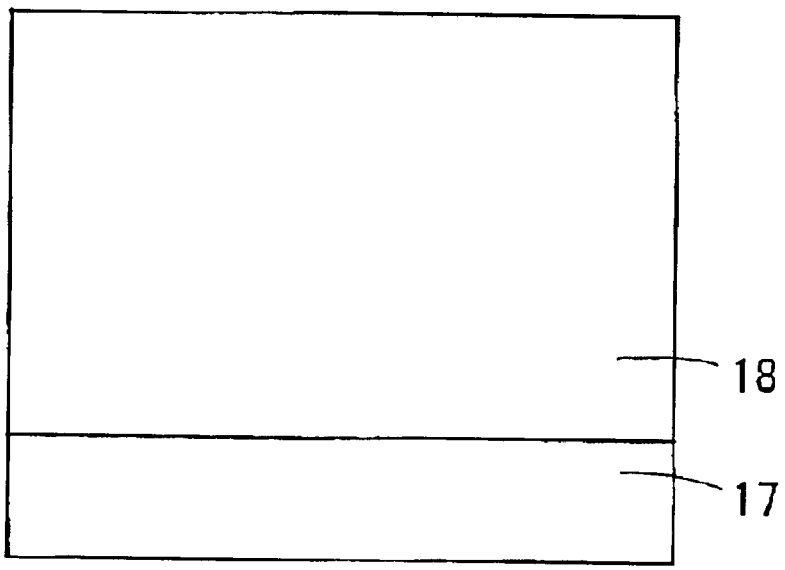
FIG. 5 is a cross-sectional view (view (a)) illustrating a manufacturing process of a semiconductor device according to a first embodiment of the present invention.

First, as shown in FIG. 5, an N⁻ epitaxial layer 18 with a resistivity of 0.3 Ωcm is formed as a drain layer using epitaxial growth to a thickness of 4 to 5 μm on a surface of a N⁺ type silicon substrate 17 that has a resistivity of 3*10⁻³ Ωcm. It should be noted that the resistivity of these parts may be changed as required.

Figure 6:
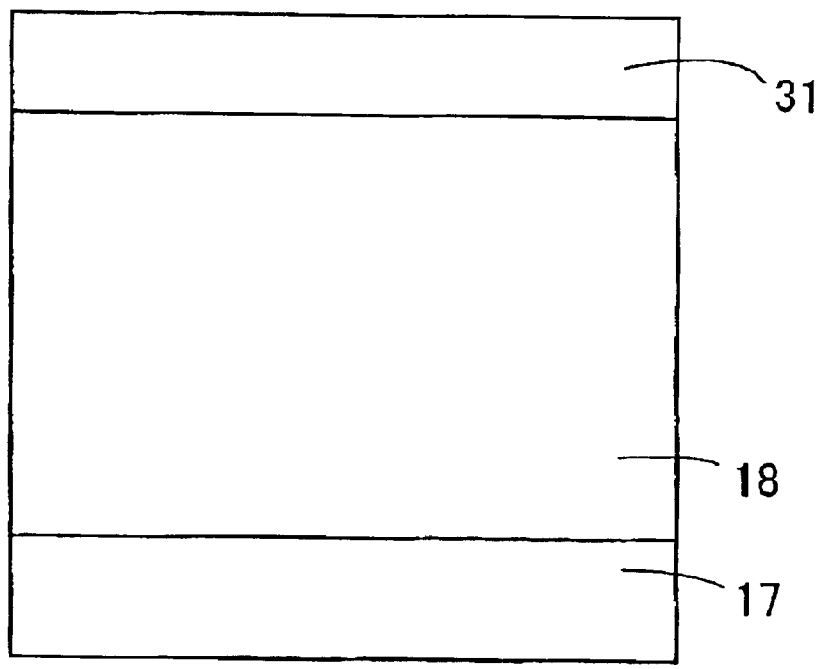
FIG. 6 is a cross-sectional view (view (b)) illustrating a manufacturing process of a semiconductor device according to a first embodiment of the present invention.
Figure 7:
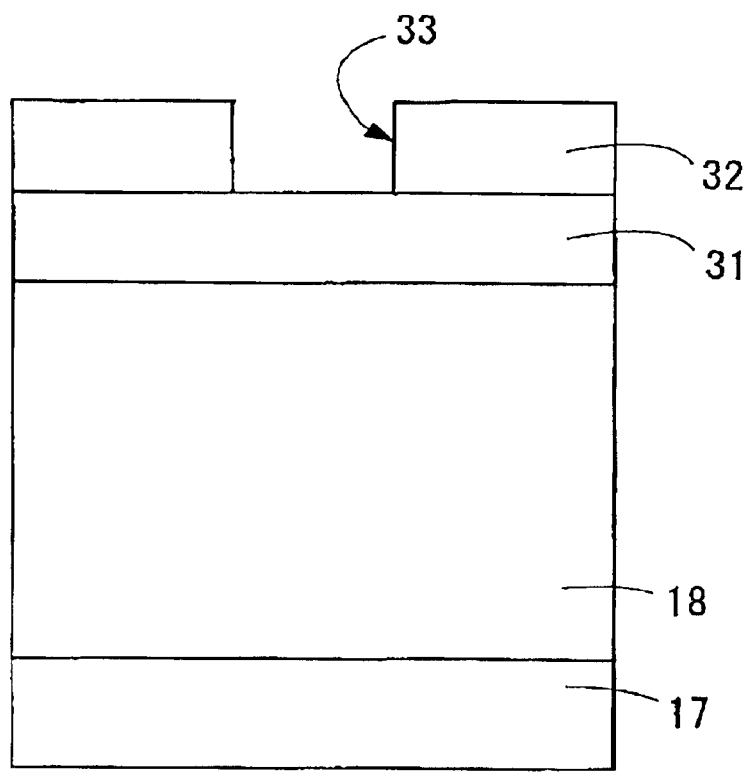
FIG. 7 is a cross-sectional view (view (c)) illustrating a manufacturing process of a semiconductor device according to a first embodiment of the present invention.

Next, as shown in FIG. 6, a thermal oxidizing process is performed so as to form a silicon oxide film 31 across the entire surface of the N⁻ epitaxial layer 18. Next, as shown in FIG. 7, a photoresist is applied to the entire surface of the silicon oxide film 31 to form a photoresist film 32. After this, the photoresist film 32 is exposed to light and developed, so as to form openings 33 at positions corresponding to where the trenches 10 are to be formed. As a result, the silicon oxide film 31 becomes exposed at the positions where the trenches 10 are to be formed.

Figure 8:
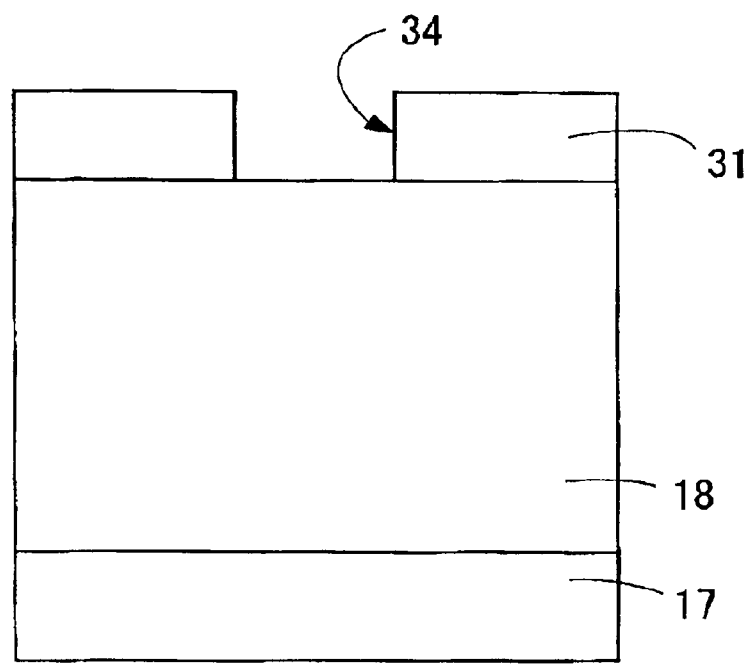
FIG. 8 is a cross-sectional view (view (d)) illustrating a manufacturing process of a semiconductor device according to a first embodiment of the present invention.
Figure 9:
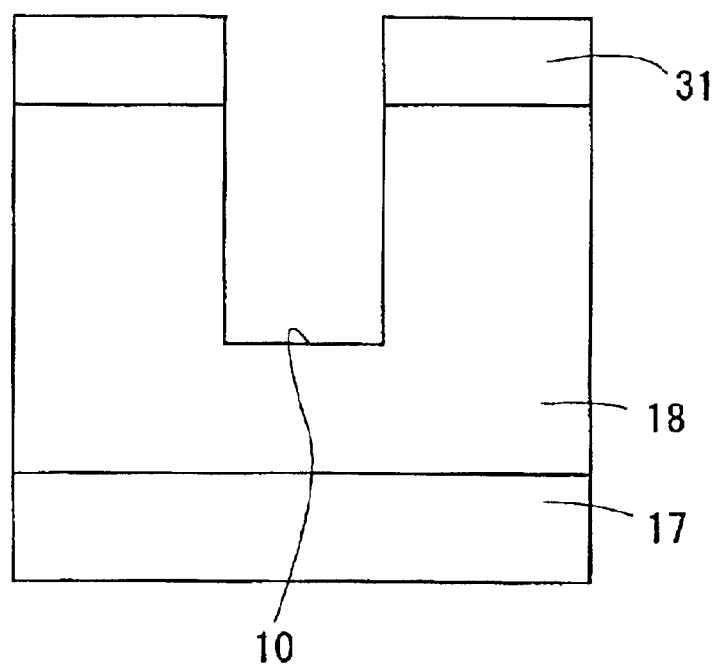
FIG. 9 is a cross-sectional view (view (e)) illustrating a manufacturing process of a semiconductor device according to a first embodiment of the present invention.

Next, as shown in FIG. 8, dry etching is performed on the silicon oxide film 31 with the photoresist film 32 as a mask, thereby forming openings 34 so that the N⁻ epitaxial layer 18 becomes exposed at the positions where the trenches 10 are to be formed. After this, as shown in FIG. 9, the trenches 10 are formed with the silicon oxide film 31 as a mask.

Figure 10:
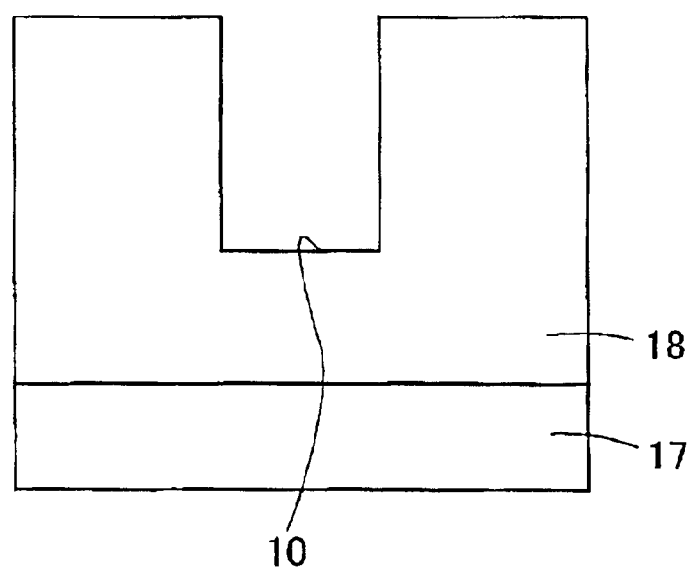
FIG. 10 is a cross-sectional view (view (f)) illustrating a manufacturing process of a semiconductor device according to a first embodiment of the present invention.

Next, as shown in FIG. 10, etching is performed on the oxide film and silicon oxide film 31 as the etching mask above the N⁻ epitaxial layer 18 is removed.

Figure 11:
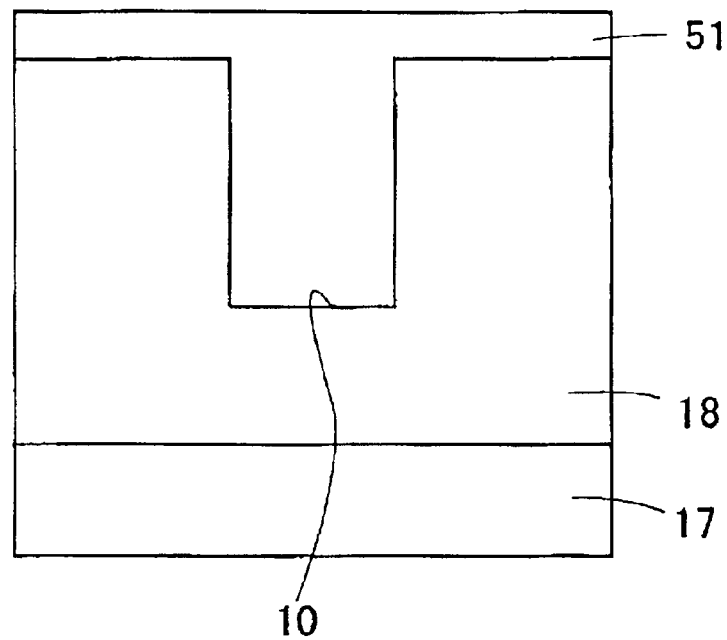
FIG. 11 is a cross-sectional view (view (g)) illustrating a manufacturing process of a semiconductor device according to a first embodiment of the present invention.

Next, as shown in FIG. 11, vapor depositing is performed, and a silicon oxide film 51 is formed on the inner surfaces of the trench 10 and on the upper surface of the N⁻ epitaxial layer 18.

Figure 12:
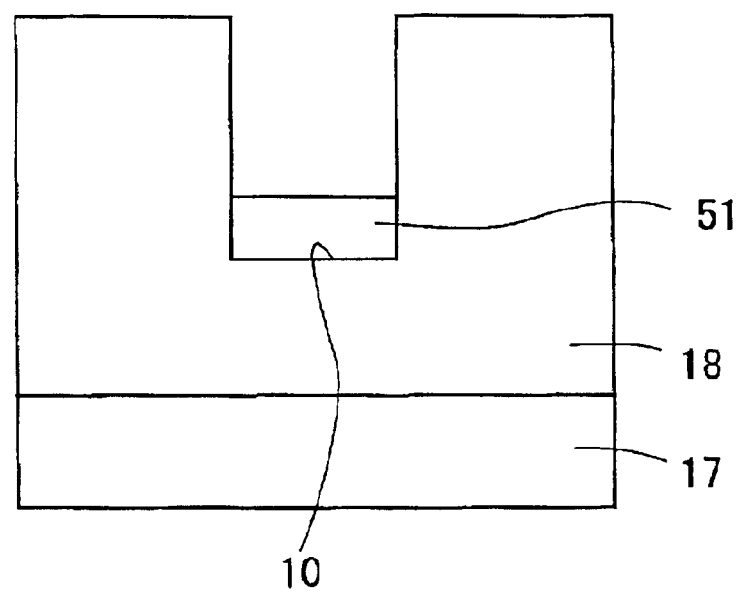
FIG. 12 is a cross-sectional view (view (h)) illustrating a manufacturing process of a semiconductor device according to a first embodiment of the present invention.

Next, as shown in FIG. 12, by performing etching back by anisotropic etching of the silicon oxide film 51, the silicon oxide film above the N⁻ epitaxial layer 18 and inside the trench is removed, leaving remains of silicon oxide film 51 in the bottom part of the trench in a part deeper than a predetermined depth.

Figure 13:
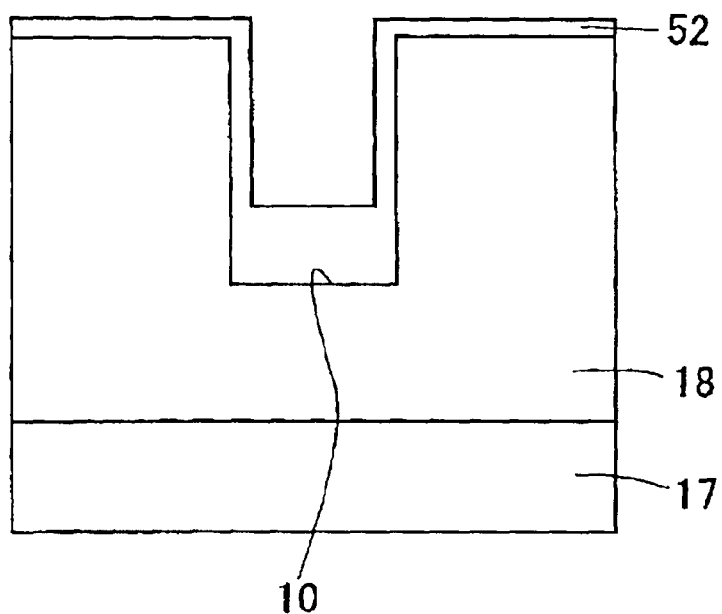
FIG. 13 is a cross-sectional view (view (i)) illustrating a manufacturing process of a semiconductor device according to a first embodiment of the present invention.

Next, as shown in FIG. 13, once more a thermal oxidizing process is performed, and on the inner surfaces of the trench a silicon oxide film 52 as a gate oxidation film is formed.

Figure 14:
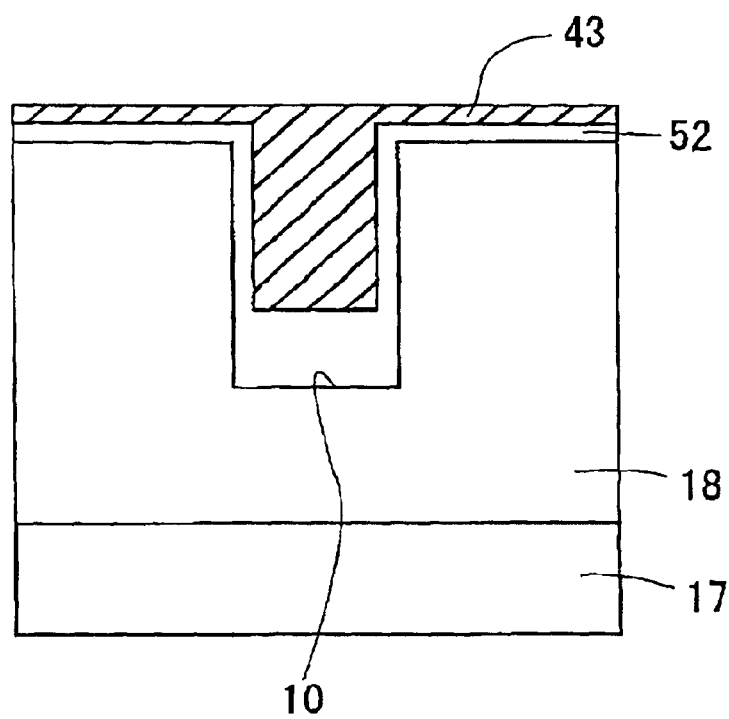
FIG. 14 is a cross-sectional view (view (j)) illustrating a manufacturing process of a semiconductor device according to a first embodiment of the present invention.

Next, as shown in FIG. 14, CVD is used to deposit phosphorus-doped polysilicon in the internal spaces of the trench 10 and the top of the silicon oxide film 52, thereby forming the polysilicon film 43.

Figure 15:
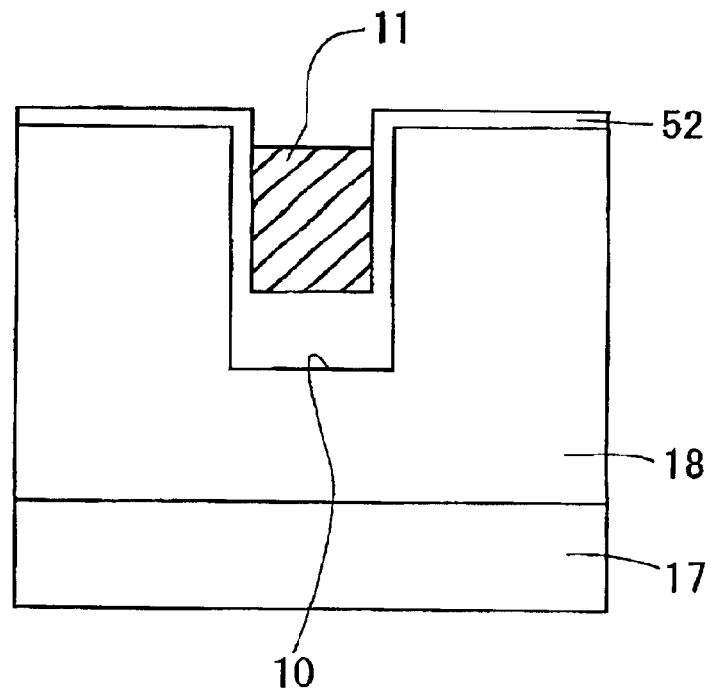
FIG. 15 is a cross-sectional view (view (k)) illustrating a manufacturing process of a semiconductor device according to a first embodiment of the present invention.
Figure 16:
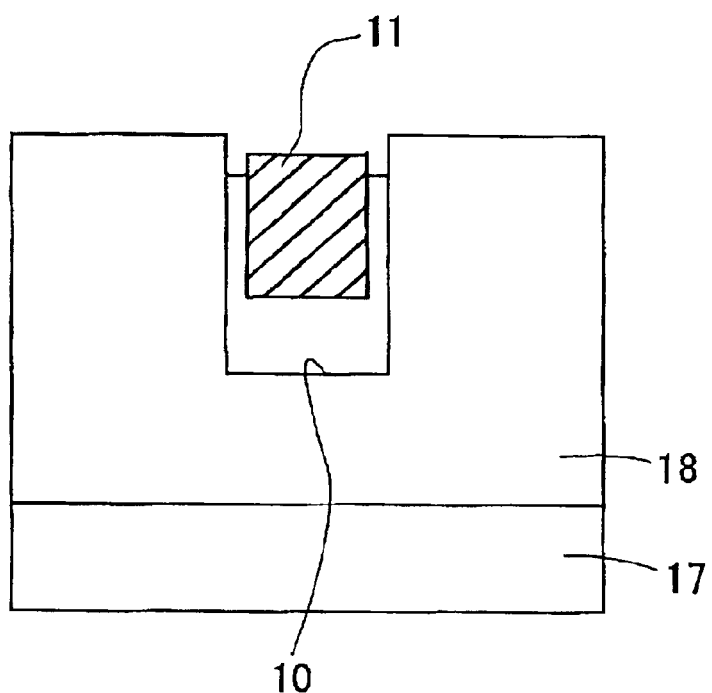
FIG. 16 is a cross-sectional view (view (l)) illustrating a manufacturing process of a semiconductor device according to a first embodiment of the present invention.

After this, as shown in FIG. 15, dry-etching is performed to remove all of the polysilicon film 43 from the top of the silicon oxide film 52 and to remove the polysilicon film 43 from the insides of the trenches 10 up to a position that is slightly deeper than the surface of the N⁻ epitaxial layer 18. As a result of this process, the gate electrode film 11 is formed on the inside of the trenches 10. Next, as shown in FIG. 16, dry-etching is performed so that all of the silicon oxide film 52 is removed from the top of the N⁻ epitaxial layer 18 and the gate insulating film (silicon oxide film) 52 is removed up to a position that is slightly deeper than the upper surface of the gate electrode film 11.

Figure 17:
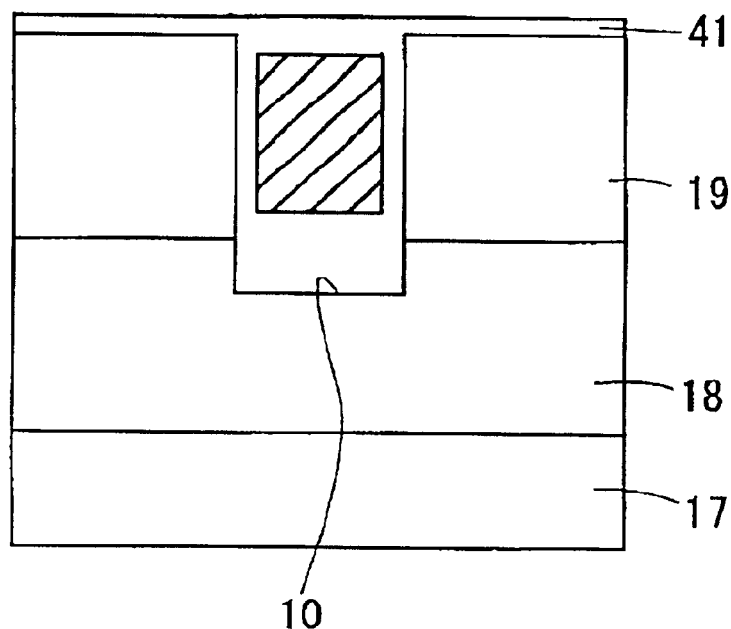
FIG. 17 is a cross-sectional view (view (m)) illustrating a manufacturing process of a semiconductor device according to a first embodiment of the present invention.
Figure 18:
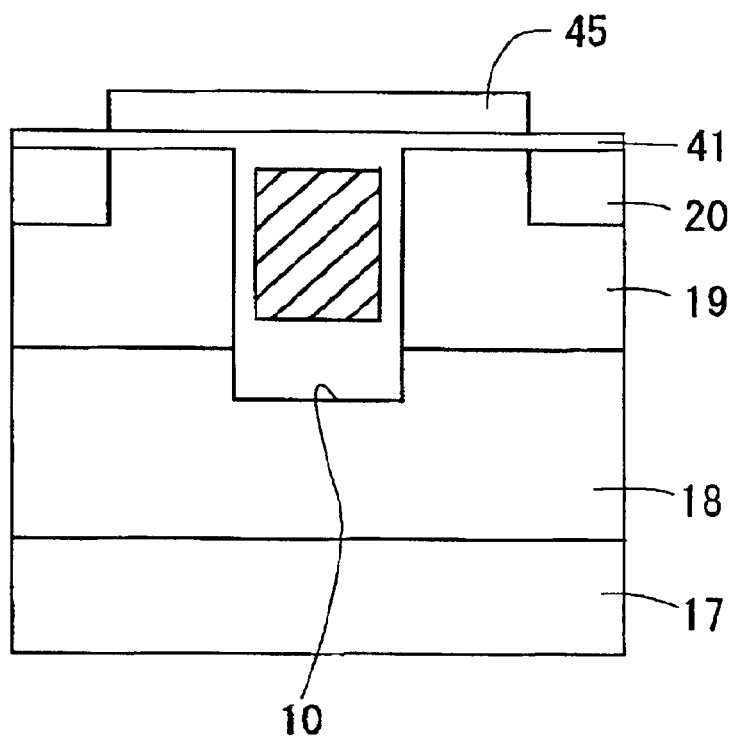
FIG. 18 is a cross-sectional view (view (n)) illustrating a manufacturing process of a semiconductor device according to a first embodiment of the present invention.

After this, as shown in FIG. 17, a thermal oxidizing process is performed so that a silicon oxide film 41 is formed on the N⁻ epitaxial layer 18, the gate electrode film 11, and the silicon oxide film 52. Boron ions (B⁺) are implanted into and dispressed within the N⁻ epitaxial layer 18 to form the P type body layer 19. At this point, the interface between the N⁻ epitaxial layer 18 and the P type body layer 19 is set so as to be at a deeper position than the deepest part of the gate electrode 11. Next, as shown in FIG. 18, a photoresist is applied to the entire surface of the silicon oxide film 41, with this then being exposed to light and developed so as to form the photoresist film 45. After this, the photoresist film 45 is used as a mask and boron ions (B⁺) are implanted into the P type body layer 19. After the photoresist film 45 has been removed, a heat treatment is performed so as to disperse the boron ions (B⁺) in the P type body layer 19, resulting in the formation of the P⁺ type dispersed regions 20.

Figure 19:
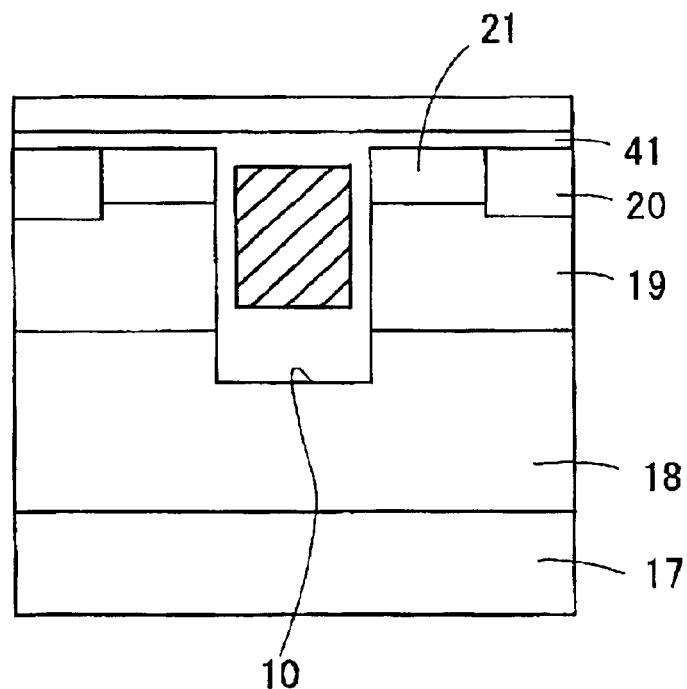
FIG. 19 is a cross-sectional view (view (o)) illustrating a manufacturing process of a semiconductor device according to a first embodiment of the present invention.
Figure 20:
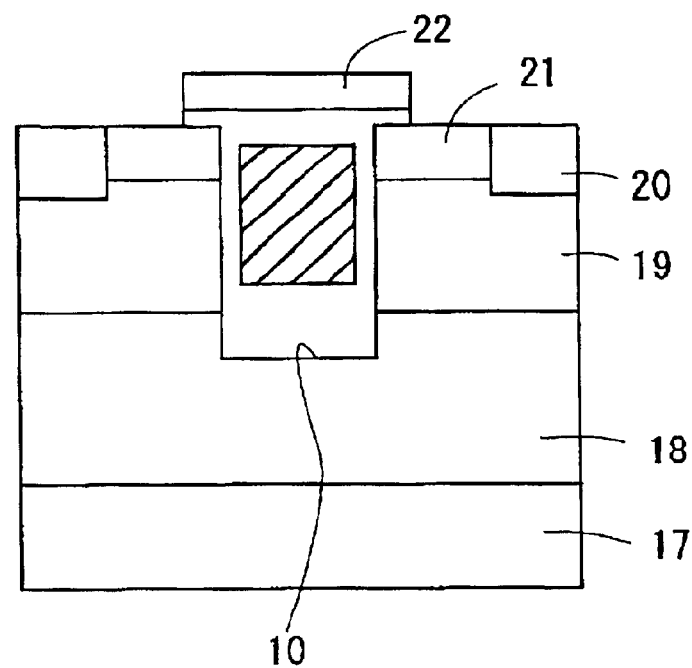
FIG. 20 is a cross-sectional view (view (p)) illustrating a manufacturing process of a semiconductor device according to a first embodiment of the present invention.

After this, a new photoresist is applied to form a photoresist film that is then exposed to light and developed. This photoresist film is used as mask and arsenic ions (As⁺) are implanted into the P type body layer 19. After this photoresist film has been removed, heat treatment is performed, resulting in the diffusion of the arsenic ions (As⁺) and the formation of the N⁺ type source regions 21. Next, as shown in FIG. 19, CVD is performed to deposit a Phospho-Silicate Glass (PSG) film on the entire surface of the silicon oxide film 41. After this, another photoresist is applied to form another photoresist film that is then exposed to light and developed. After this, as shown in FIG. 20, dry-etching is performed on the silicon oxide film 41 and the PSG film with the photoresist film as a mask, so that only the parts of the silicon oxide film 41 and the PSG film that cover the trenches 10 or are peripheral to the trenches 10 are left. The remaining parts of the PSG film form the interlayer dielectric 22.

Figure 21:
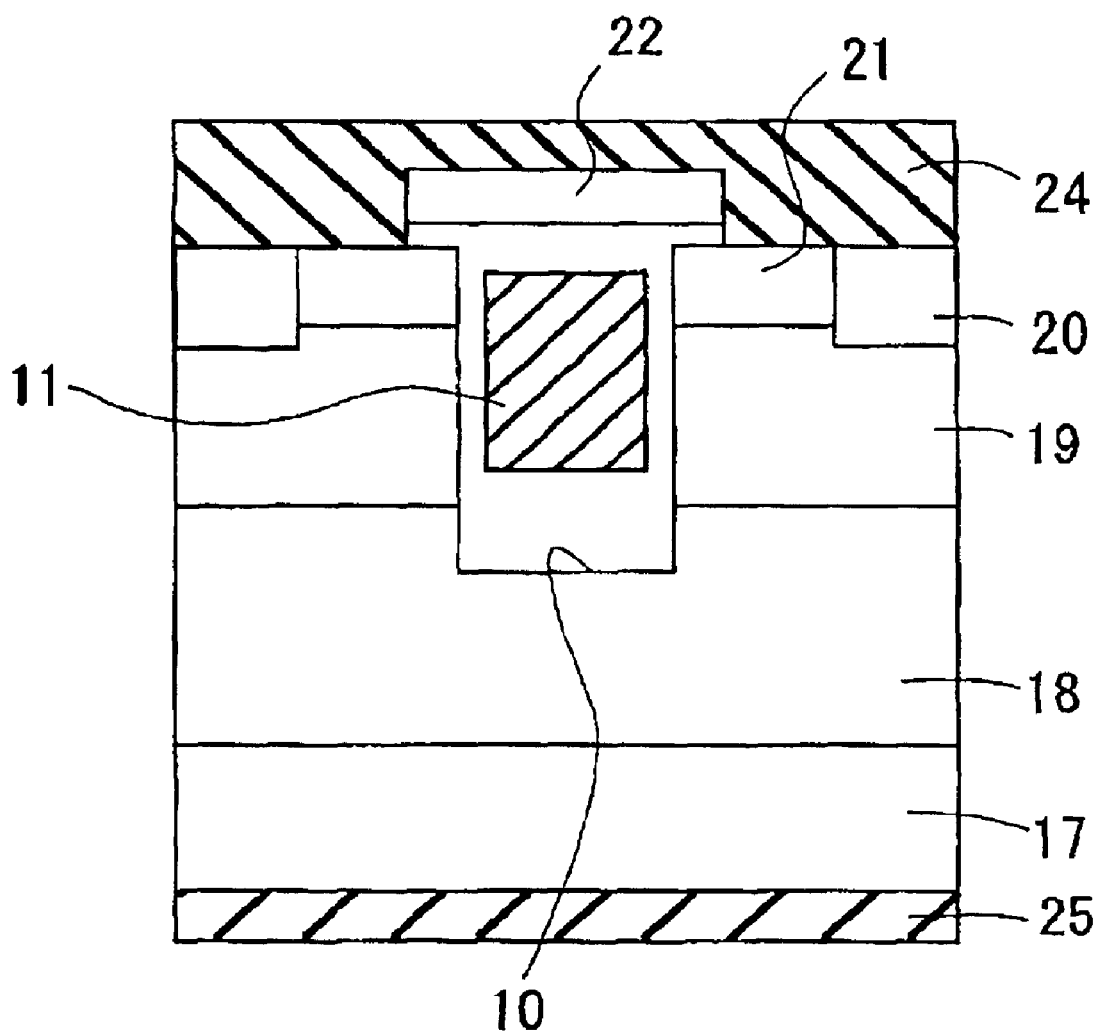
FIG. 21 is a cross-sectional view (view (q)) illustrating a manufacturing process of a semiconductor device according to a first embodiment of the present invention.

Finally, as shown in FIG. 21, aluminum is sputtered onto the surfaces of the interlayer dielectric 22 and the P type body layer 19 so as to form an aluminum film. A photoresist is then applied, exposed to light and developed. Unnecessary parts (not shown in the drawing) are then removed by dry-etching to form a source electrode film 24. Also, a drain electrode film 25 is formed on the rear surface of the N⁺ type silicon substrate 17 by forming a metal thin film using vapor deposition.

With the above manufacturing process, it is easy to form a gate electrode film 11 whose bottom part is shallower than the interface between the interface between the N⁻ epitaxial layer 18 and the P type body layer 19. It should be noted that while the N⁻ epitaxial layer 18 is produced in the above process through an epitaxial growth, the N⁻ epitaxial layer 18 may be formed by a surface diffusion method. Also, while the source electrode film 24 is described as being formed of aluminum, a different metal, such as copper, may be used.

(Second Embodiment)

Figure 22:
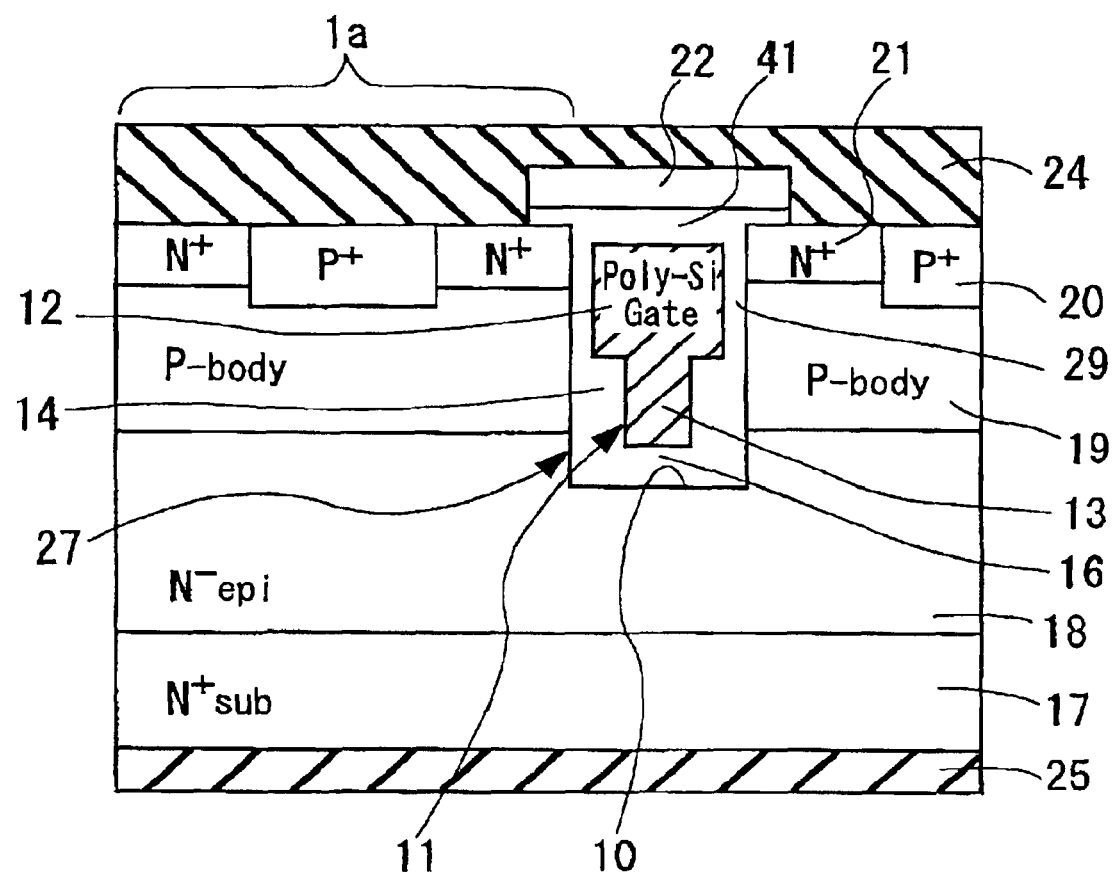
FIG. 22 is a cross-sectional view of a semiconductor device according to the second embodiment of the present invention.

The following is a detailed description, with reference to the attached drawings, of a semiconductor device that is a second embodiment of the present invention. FIG. 22 is a cross-sectional view of a semiconductor device of this second embodiment of the present invention. In this drawing, numeral 1a indicates a cell, numeral 12 indicates gate electrode film upper parts, numeral 13 indicates gate electrode film lower parts, numeral 14 indicates lower side surface parts, and numeral 29 indicates upper side surface parts. The other numerals denote the same parts as in FIG. 1.

As shown in FIG. 22, the cross-sectional form of the semiconductor device of this second embodiment of the present invention is such that the lower side surface parts 14 of the gate insulating film 27 are thicker than the upper side surface parts 29 of the gate insulating film 27. As a result, the gate electrode film upper parts 12 are thicker than the gate electrode film lower parts 13. The remaining parts of the construction are the same as in the first embodiment that is described above.

Consequently, in this second embodiment, the bottom surface parts 16 and also the lower side surface parts 14 of the gate insulating film 27 are thicker than other parts of the gate insulating film 27, so that the On resistance $R_{on}$ is even lower than in the first embodiment of the present invention. It should be noted that in this second embodiment of the present invention, the gate electrode film upper parts 12 may be positioned above the interface between the N⁻ epitaxial layer 18 and the P type body layer 19 and the lower tips of the gate electrode film lower parts 13 may be positioned below this interface. Also, the gate electrode film lower parts 13 may be produced in a different form, such as form where a central portion is thicker than the upper and lower ends, a funnel shape, or a dome shape.

Figure 23:
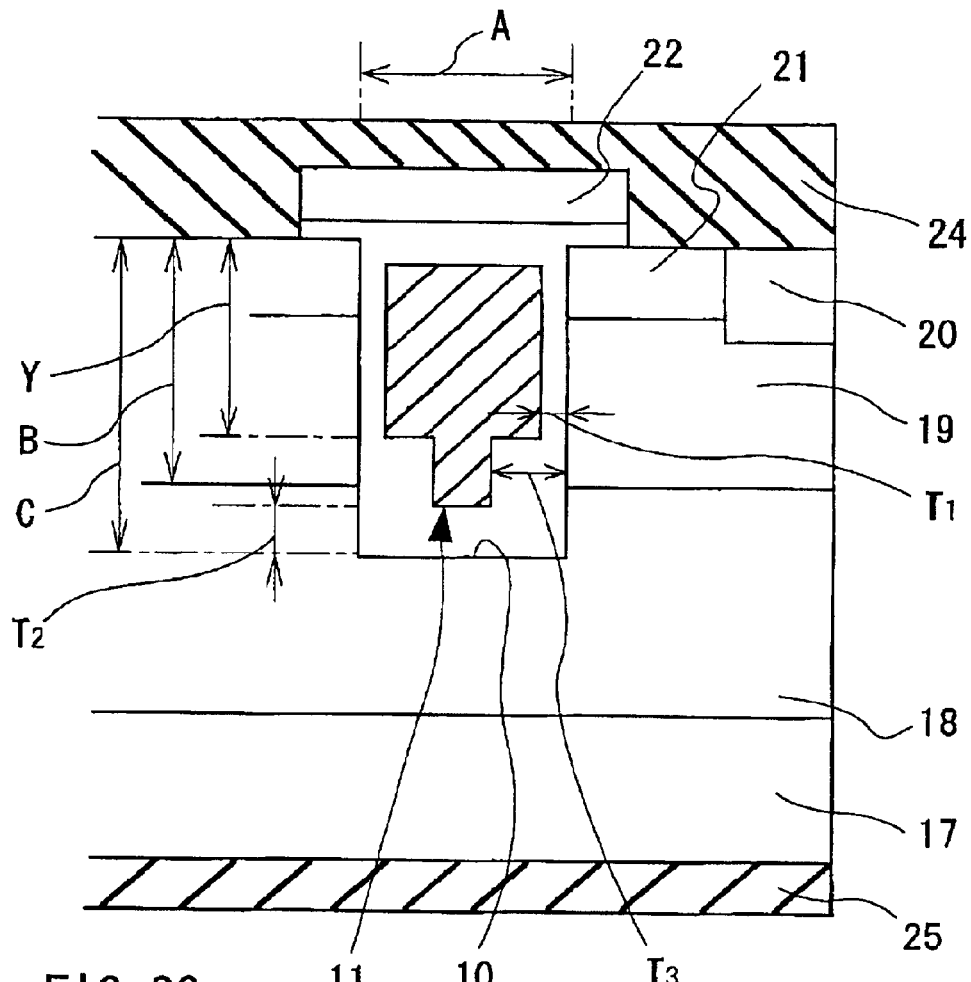
FIG. 23 shows a first experimental example of a semiconductor device according to the second embodiment of the present invention.

The following describes two experimental examples of a semiconductor device according to the second embodiment of the present invention. FIG. 23 shows a first experimental example of the semiconductor device according to the second embodiment of the present invention. In FIG. 23, the variable $T_1$ is the thickness of the upper side surface part 29 of the gate insulating film 27 that is in contact with the gate electrode film upper parts 12, the variable $T_2$ is the distance between the lower tips of the gate electrode film lower parts 13 and the bottom surface of a trench 10, the variable $T_3$ is the distance between the side surfaces of a gate electrode film lower parts 13 and the side surface of a trench 10, and the variable Y is the distance (depth) from the surface of the semiconductor device to the lower tip of the gate electrode film upper parts 12. It should be noted that the other numerals are the same as in FIG. 3. In the experimental example shown in FIG. 23, it is assumed that the variable A is 0.8 μm, the variable B is 1.3 μm, the variable C is 1.6 μm, the variable $T_1$ is 50 nm, and the variables $T_2$ and $T_3$ are both 0.25 μm. For this construction, the same voltages as in the experiment shown in FIG. 3 are applied between the source electrode film 24 and the drain electrode film 25 and between the gate electrode film 11 and the source electrode film 24.

Figure 24:
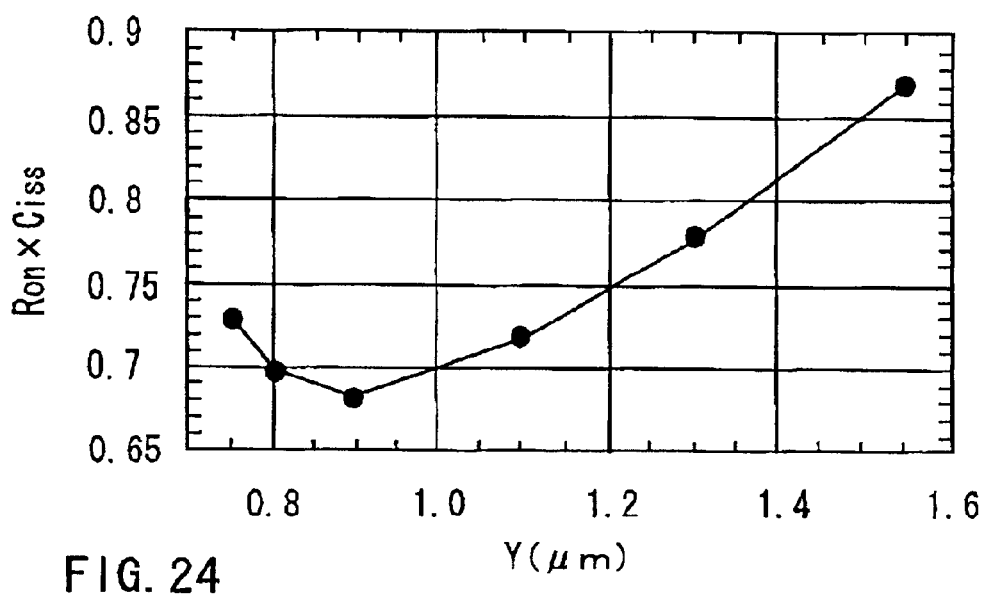
FIG. 24 shows the relationship between the On resistance $R_{on}$ and the capacitance $C_{iss}$ for the first experimental example of the semiconductor device according to the second embodiment of the present invention.

FIG. 24 shows the relationship between the On resistance $R_{on}$ and the capacitance $C_{iss}$ for the first experimental example of a semiconductor device according to the second embodiment of the present invention. In FIG. 24, the index value representing the product of the On resistance $R_{on}$ and the capacitance $C_{iss}$ is the same value as for the experimental example that is shown in FIG. 3. As shown in FIG. 24, for the construction shown in FIG. 23, the product of the On resistance $R_{on}$ and the capacitance $C_{iss}$ reached its lowest value when the variable Y was in a range of around 0.8 μm to 1.0 μm. This value is slightly smaller than the value for the experimental example of the first embodiment. This means that when a stepped part is provided in a vicinity of a center of the gate electrode film 11 and the depth of the lower tips of the gate electrode film upper parts 12 is set at around 50 to 60% of the depth of the trench 10, the obtained results are even more favorable than those obtained for the example shown in FIG. 4, though the manufacturing process does become more complicated.

Figure 25:
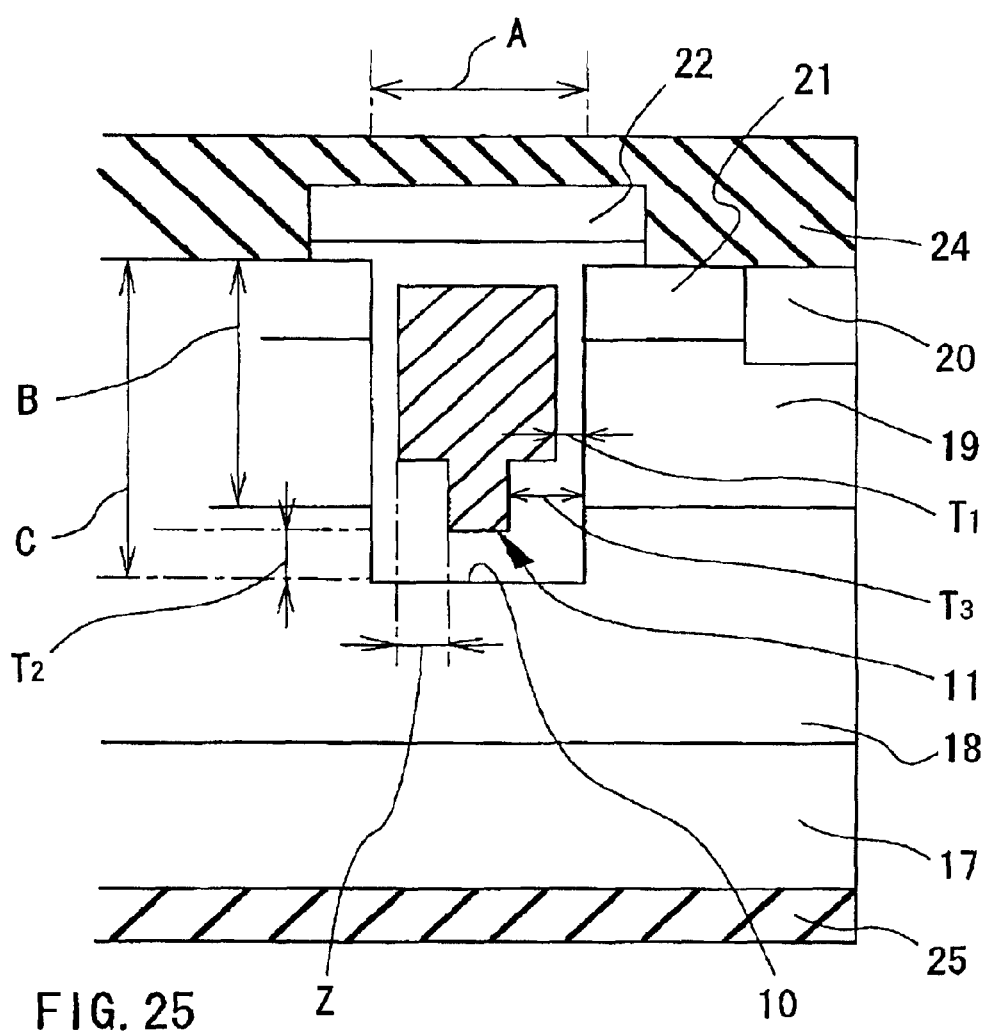
FIG. 25 shows a second experimental example of a semiconductor device according to the second embodiment of the present invention.

FIG. 25 shows a second experimental example of the semiconductor device according to the second embodiment of the present invention. In FIG. 25, the variable Z is the difference in thickness in the horizontal direction between the gate electrode film upper parts 12 and the gate electrode film lower parts 13. It should be noted that the other numerals are the same as in FIG. 3. In the experimental example shown in FIG. 25, the variable A was set at 0.8 μm, the variable B was set at 1.3 μm, the variable C was set at 1.6 μm, the variable $T_1$ was set at 50 nm, and the variable $T_2$ was set at 0.25 μm. As a result, in this experimental example, the lower tips of the gate electrode film upper parts 12 are positioned above the interface between the N⁻ epitaxial layer 18 and the P type body layer 19, while the lower tips of the gate electrode film lower parts 13 are positioned below this interface. For this construction, the same voltages as in the experiment shown in FIG. 3 were applied between the source electrode film 24 and the drain electrode film 25 and between the gate electrode film 11 and the source electrode film 24.

Figure 26:
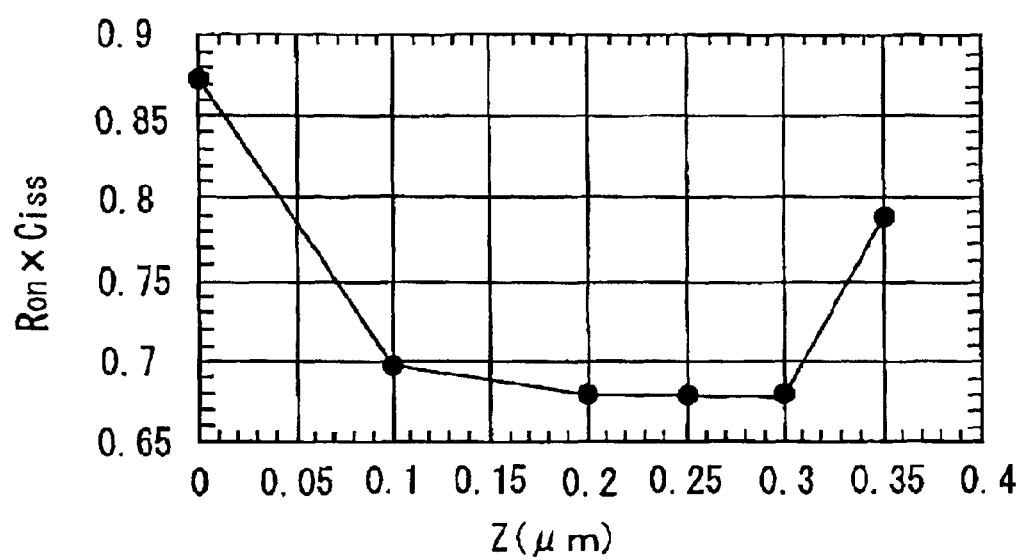
FIG. 26 shows the relationship between the On resistance $R_{on}$ and the capacitance $C_{iss}$ for the second experimental example of the semiconductor device according to the second embodiment of the present invention.

FIG. 26 shows the relationship between the On resistance $R_{on}$ and the capacitance $C_{iss}$ for the second experimental example of a semiconductor device according to the second embodiment of the present invention. As shown in FIG. 26, for the construction shown in FIG. 25, the product of the On resistance $R_{on}$ and the capacitance $C_{iss}$ reached its lowest value when the variable Z was in a range of around 0.1 μm to 0.3 μm. As a result, it can be said that the most preferable thickness for the gate electrode film lower parts 13 is a range of around 30 to 85% of the thickness of the gate electrode film upper parts 12. Also, while in this experimental example, the lower tips of the gate electrode film lower parts 13 are positioned below the boundary faces between the N⁻ epitaxial layer 18 and the P type body layer 19, judging from the product of the On resistance $R_{on}$ and the capacitance $C_{iss}$ alone, this was not especially disadvantageous when compared to the first experimental example. Accordingly, in view of both the On resistance $R_{on}$ and the capacitance $C_{iss}$, it can be said that it is most favoarble for the gate electrode film 11 to have a length that is around 50 to 60% of the depth of the trenches 10, with a stepped part being formed near the center of the gate electrode film 11 and the thickness of the gate electrode film lower parts 13 being in a range of around 30 to 85% of the thickness of the gate electrode film upper parts 12.

The following describes the manufacturing process for a semiconductor device according to the second embodiment of the present invention. FIGS. 27 to 48 are a series (a) to (v) of cross-sectional drawings that illustrate the manufacturing process for a semiconductor device according to the second embodiment of the present invention. In these drawings, the numerals 31, 36, 41, and 42 are silicon oxide films, numerals 32 and 45 are photoresist films, numerals 33 and 34 are openings, numerals 10 and 35 are trenches, numeral 37 is a silicon nitride film, numerals 38, 39, and 40 are side surfaces in the trench, numeral 43 is a polysilicon film, and numeral 44 is a stepped part.

Figure 27:
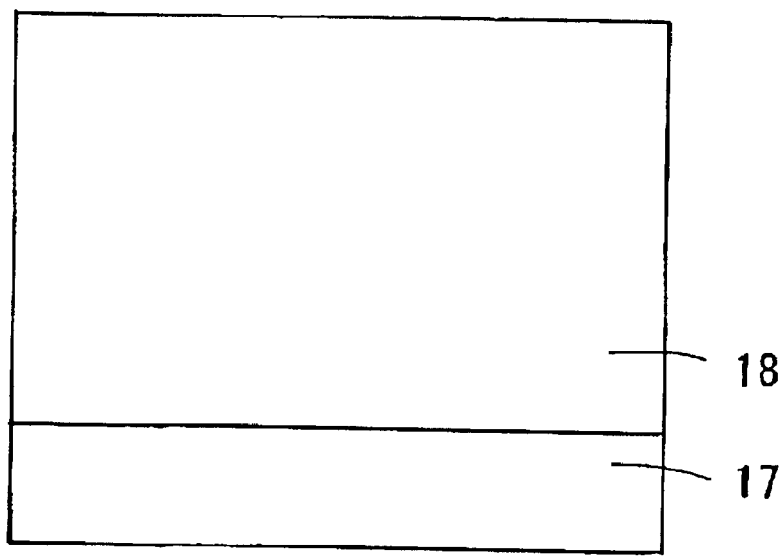
FIG. 27 is a cross-sectional view (view (a)) illustrating a manufacturing process of a semiconductor device according to a second embodiment of the present invention.

First, as shown in FIG. 27, an N⁻ epitaxial layer 18 with a resistivity of 0.3 Ωcm is formed as a drain layer using epitaxial growth to a thickness of 4 to 5 μm on a surface of a N⁺ type silicon substrate 17 that has a resistivity of 3*10⁻³ Ωcm. It should be noted that the resistivity of these parts may be changed as required.

Figure 28:
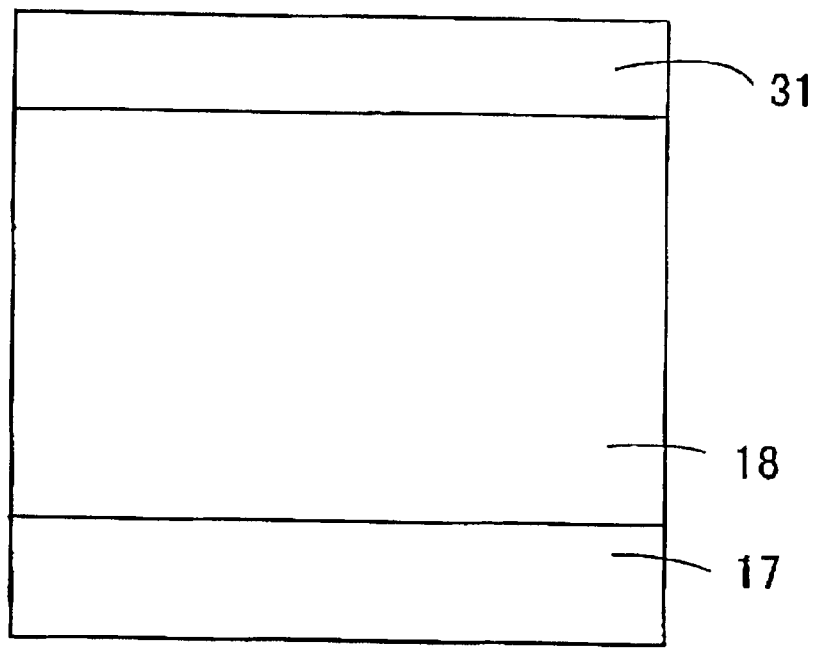
FIG. 28 is a cross-sectional view (view (b)) illustrating a manufacturing process of a semiconductor device according to a second embodiment of the present invention.
Figure 29:
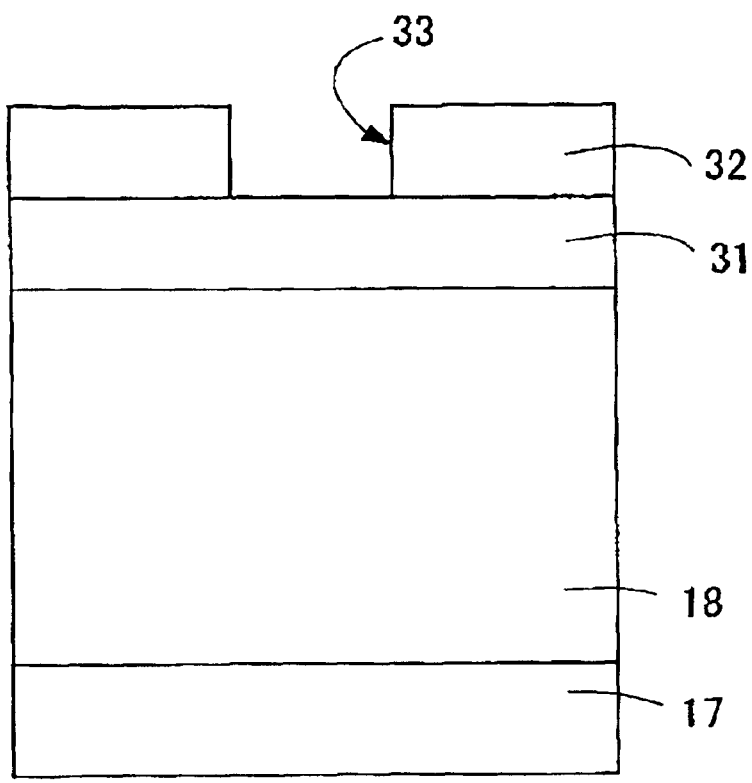
FIG. 29 is a cross-sectional view (view (c)) illustrating a manufacturing process of a semiconductor device according to a second embodiment of the present invention.

Next, as shown in FIG. 28, a thermal oxidizing process is performed so as to form a silicon oxide film 31 across the entire surface of the N⁻ epitaxial layer 18. Next, as shown in FIG. 29, a photoresist is applied to the entire surface of the silicon oxide film 31 to form a photoresist film 32. After this, the photoresist film 32 is exposed to light and developed, so as to form openings 33 at positions corresponding to where the trenches 10 are to be formed. As a result, the silicon oxide film 31 becomes exposed at the positions where the trenches 10 are to be formed.

Figure 30:
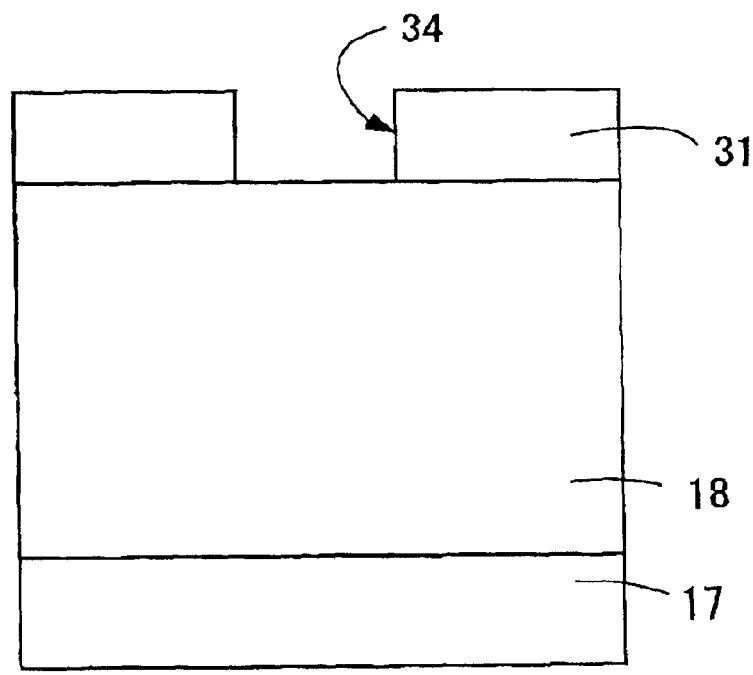
FIG. 30 is a cross-sectional view (view (d)) illustrating a manufacturing process of a semiconductor device according to a second embodiment of the present invention.
Figure 31:
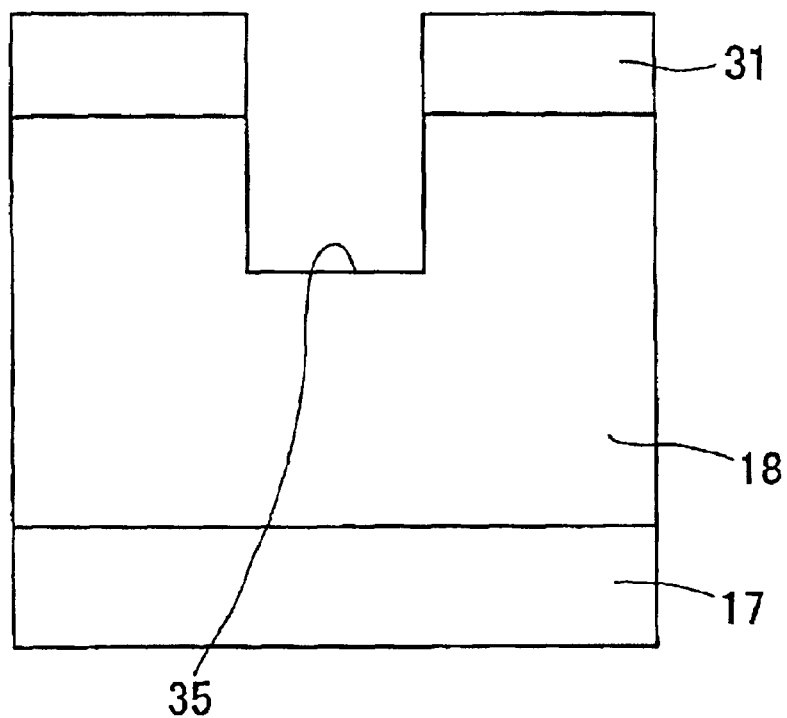
FIG. 31 is a cross-sectional view (view (e)) illustrating a manufacturing process of a semiconductor device according to a second embodiment of the present invention.

Next, as shown in FIG. 30, dry etching is performed on the silicon oxide film 31 with the photoresist film 32 as a mask, thereby forming openings 34 so that the N⁻ epitaxial layer 18 becomes exposed at the positions where the trenches 10 are to be formed. After this, as shown in FIG. 31, the trenches 35 are formed with the silicon oxide film 31 as a mask.

Figure 32:
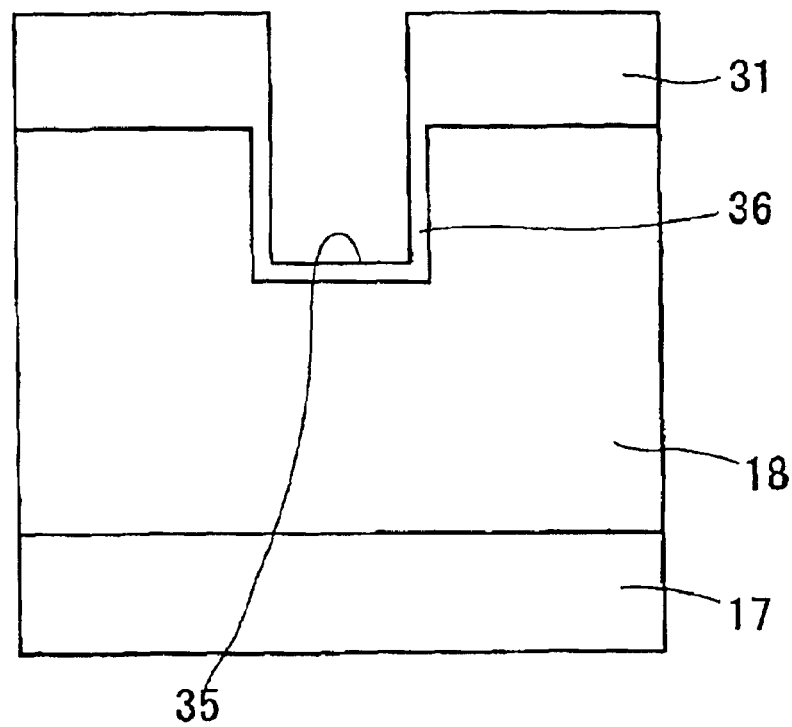
FIG. 32 is a cross-sectional view (view (f)) illustrating a manufacturing process of a semiconductor device according to a second embodiment of the present invention.
Figure 33:
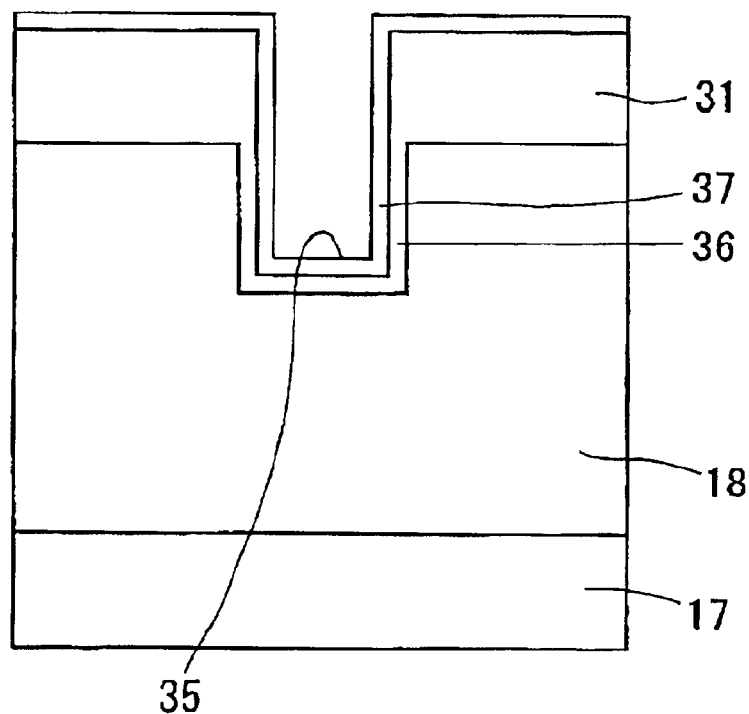
FIG. 33 is a cross-sectional view (view (g)) illustrating a manufacturing process of a semiconductor device according to a second embodiment of the present invention.

Next, as shown in FIG. 32, a thermal oxidizing process is performed so as to form a silicon oxide film across the entire surface of the silicon oxide film 31 and on the internal surfaces of the trenches 35. During this process, the parts of the N⁻ epitaxial layer 18 that are exposed around the inner surfaces of the trenches 35 are covered with a silicon oxide film 36. Next, as shown in FIG. 33, CVD (Chemical Vapor Deposition) is performed so as to form a silicon nitride film 37 through deposition on the entire surfaces of the silicon oxide film 31 and the silicone oxide film 36 on the inner surfaces of the trenches 35.

Figure 34:
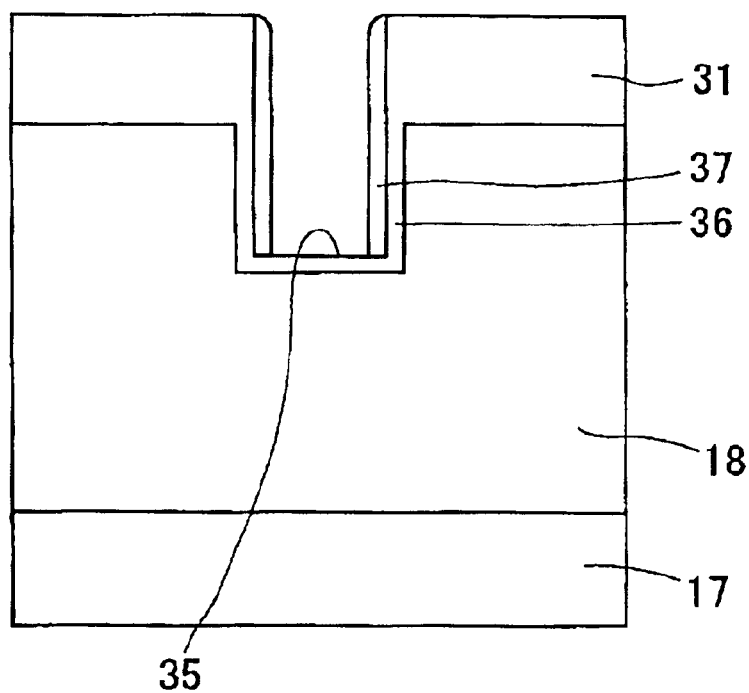
FIG. 34 is a cross-sectional view (view (h)) illustrating a manufacturing process of a semiconductor device according to a second embodiment of the present invention.
Figure 35:
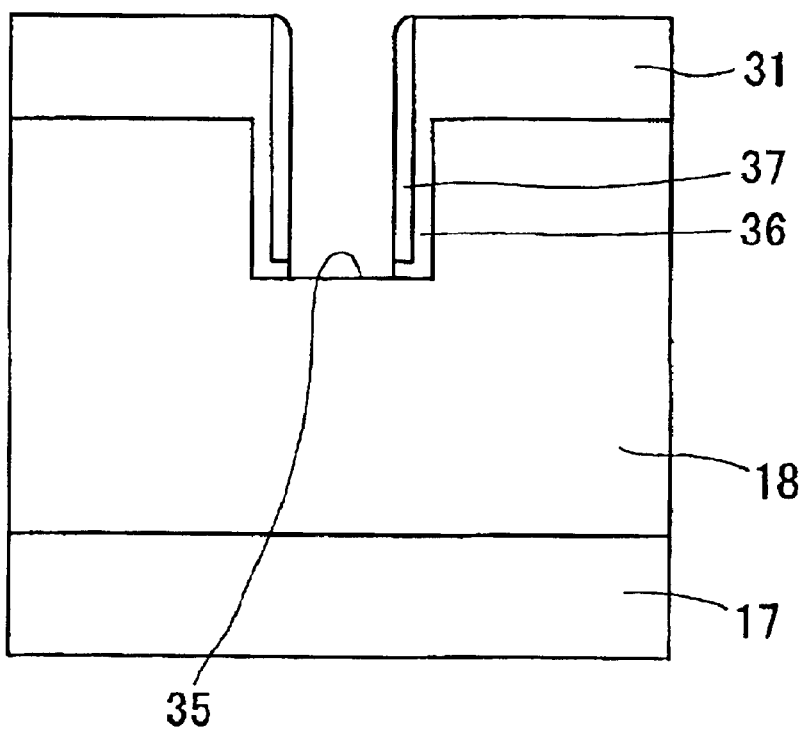
FIG. 35 is a cross-sectional view (view (i)) illustrating a manufacturing process of a semiconductor device according to a second embodiment of the present invention.

Next, as shown in FIG. 34, anisotropic etching is performed on the silicon nitride film 37 so as to remove the silicon nitride film 37 from the surface of the silicon oxide film 31 and the bottom surfaces of the trenches 35. As a result of this process, the silicon nitride film 37 remains only on the side surfaces of the trenches 35. Also, as shown in FIG. 35, dry etching is performed so as to remove all of the silicon oxide film 36 from the top of the silicon oxide film 31 and the bottom surfaces of the trenches 35. This results in the N⁻ epitaxial layer 18 becoming exposed once more at the bottom surfaces of the trenches 35.

Figure 36:
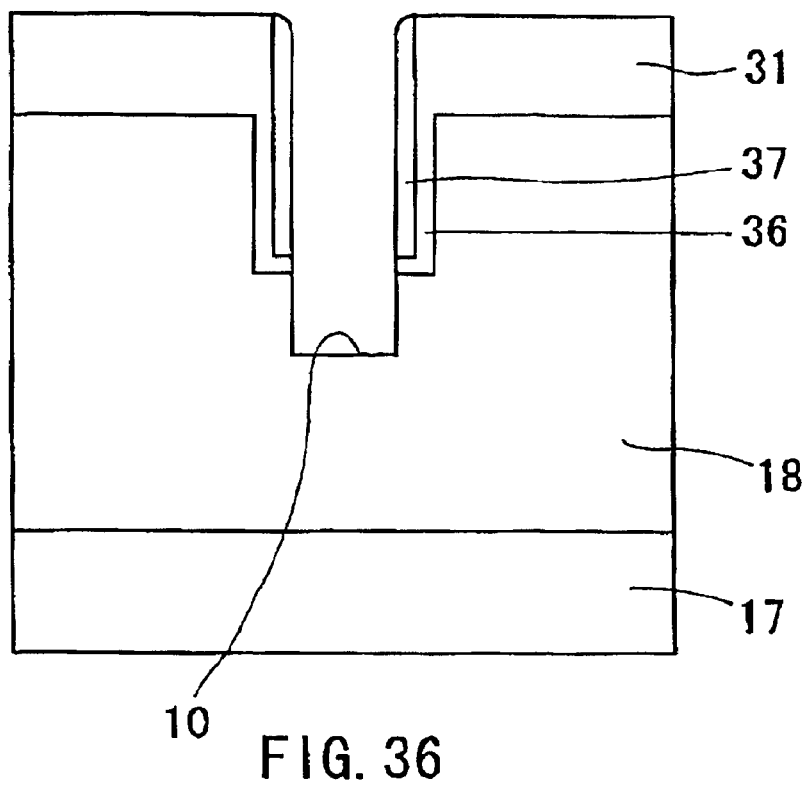
FIG. 36 is a cross-sectional view (view (j)) illustrating a manufacturing process of a semiconductor device according to a second embodiment of the present invention.
Figure 37:
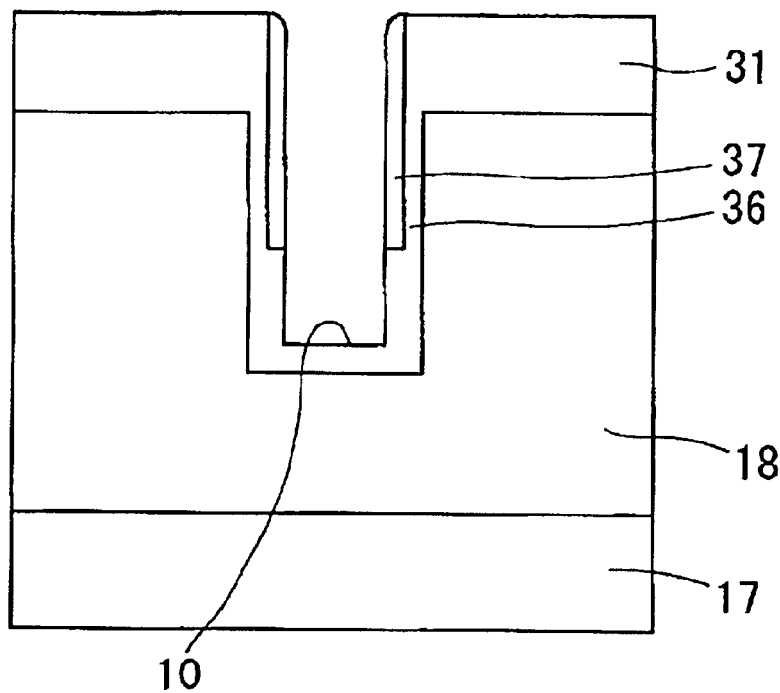
FIG. 37 is a cross-sectional view (view (k)) illustrating a manufacturing process of a semiconductor device according to a second embodiment of the present invention.

Next, as shown in FIG. 36, anisotropic etching is performed on the N⁻ epitaxial layer 18 that is exposed at the bottom surfaces of the trenches 35, so that the trenches 35 extend deeper into the N⁻ epitaxial layer 18. The digging of the trenches is complete at this point, with the resulting trenches being in the form of the trenches 10. After this, as shown in FIG. 37, a thermal oxidizing process is performed so that the N⁻ epitaxial layer 18 that is exposed at the bottom of the trenches 10 is oxidized.

Figure 38:
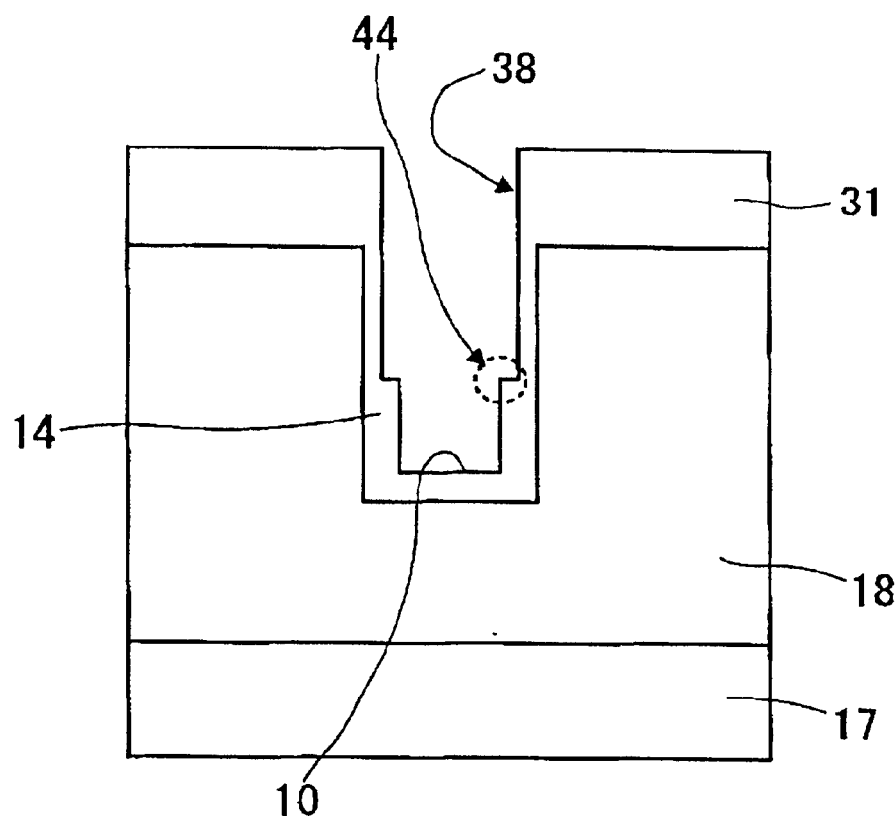
FIG. 38 is a cross-sectional view (view (l)) illustrating a manufacturing process of a semiconductor device according to a second embodiment of the present invention.
Figure 39:
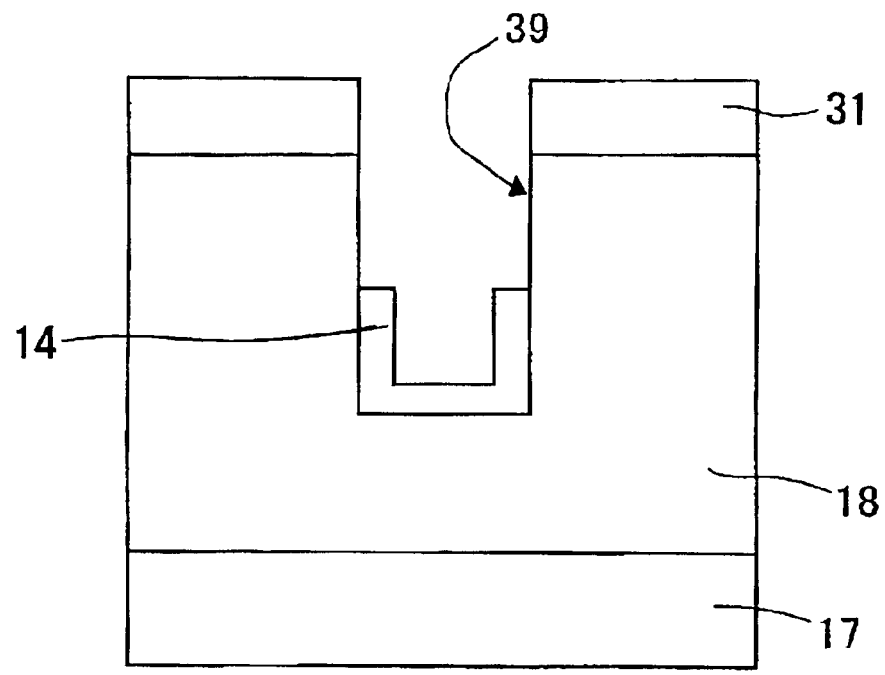
FIG. 39 is a cross-sectional view (view (m)) illustrating a manufacturing process of a semiconductor device according to a second embodiment of the present invention.

After this, as shown in FIG. 38, the silicon nitride film 37 that remains on the sides of the trenches 10 is removed by dry etching, so that the silicon oxide film 36 on the trench side surfaces 38 becomes exposed. At this point, the silicon oxide film 36 extends so as to be exposed all around the inner surfaces of the trenches 10, with the trenches 10 having stepped sides where the parts above and below the boundary 44 have different thicknesses. Next, as shown in FIG. 39, wet etching is performed so that part of the silicon oxide film 31 above the N⁻ epitaxial layer 18 and the silicon oxide film 36 in the upper parts of the internal side surfaces of the trenches 10 are completely removed, thereby exposing the side surfaces 39. As a result of this process, a silicon oxide film with a roughened surface is removed.

Figure 40:
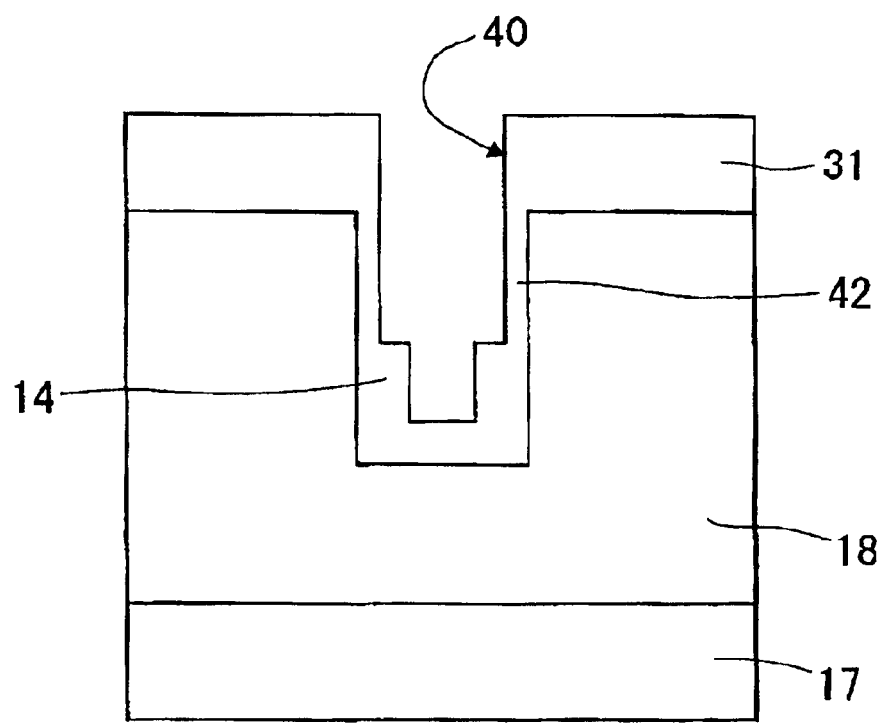
FIG. 40 is a cross-sectional view (view (n)) illustrating a manufacturing process of a semiconductor device according to a second embodiment of the present invention.
Figure 41:
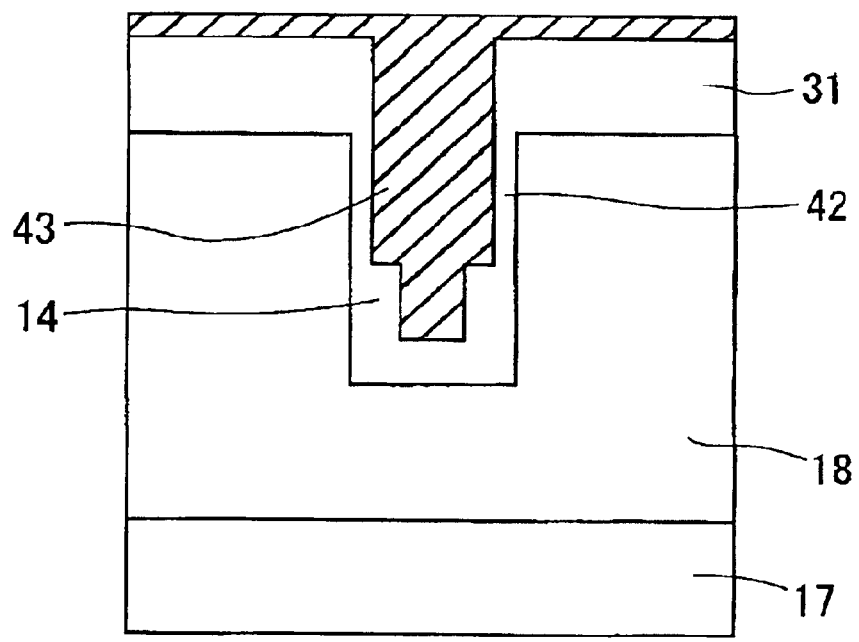
FIG. 41 is a cross-sectional view (view (o)) illustrating a manufacturing process of a semiconductor device according to a second embodiment of the present invention.

After this, as shown in FIG. 40, a thermal oxidizing process is performed yet again so as to form a silicon oxide film 42 on the silicon oxide film 31 and the inner surfaces of the trenches 10. As a result of this process, a silicon oxide film is formed once again on the upper parts of the side surfaces of the trenches 10, thereby covering the trench side surfaces 40 with a silicon oxide film. Next, as shown in FIG. 41, CVD is used to deposit phosphorus-doped polysilicon in the internal spaces of the trenches 10 and the top of the silicon oxide film 31, thereby forming the polysilicon film 43.

Figure 42:
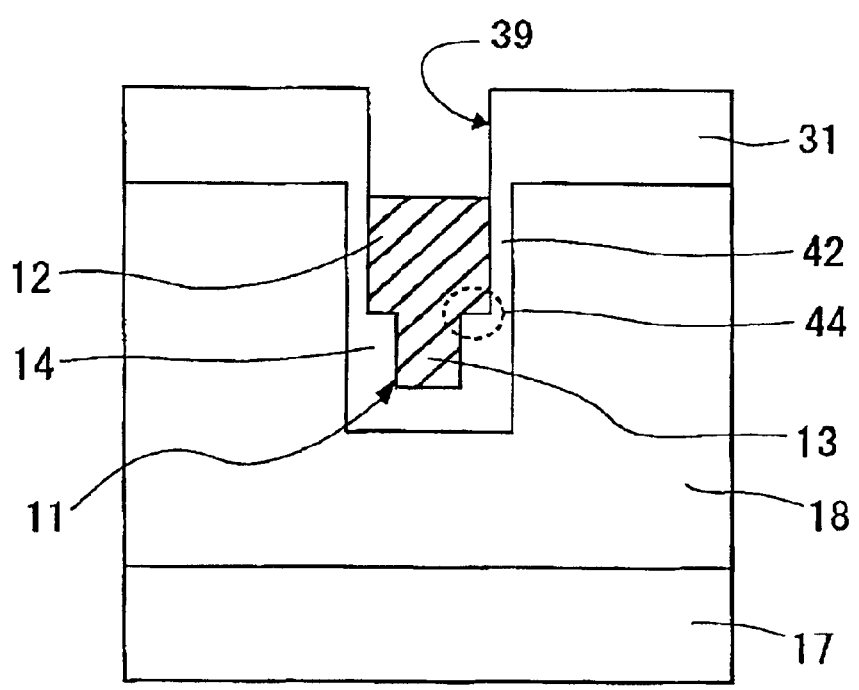
FIG. 42 is a cross-sectional view (view (p)) illustrating a manufacturing process of a semiconductor device according to a second embodiment of the present invention.
Figure 43:
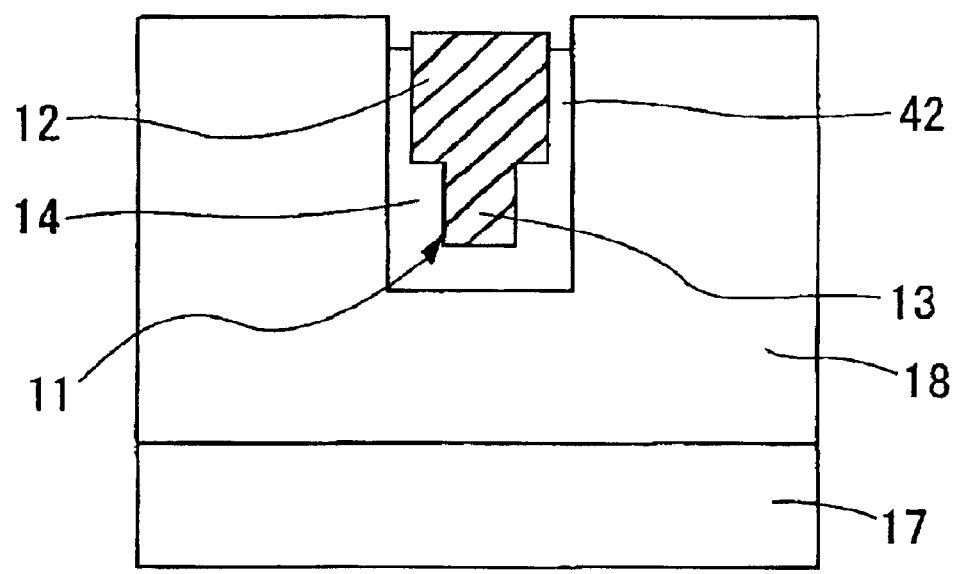
FIG. 43 is a cross-sectional view (view (q)) illustrating a manufacturing process of a semiconductor device according to a second embodiment of the present invention.

After this, as shown in FIG. 42, dry-etching is performed to remove all of the polysilicon film 43 from the top of the silicon oxide film 31 and to remove the polysilicon film 43 from the insides of the trenches 10 up to a position that is slightly deeper than the surface of the N⁻ epitaxial layer 18. As a result of this process, the gate electrode film 11 is formed on the inside of the trenches 10. Also, due to the presence of the stepped parts 44 in the trenches 10, the gate electrode film upper parts 12 are thicker than the gate electrode film lower parts 13. Next, as shown in FIG. 43, dry-etching is performed so that all of the silicon oxide film 31 is removed from the top of the N⁻ epitaxial layer 18 and the gate insulating film (silicon oxide film) 42 is removed up to a position that is slightly deeper than the upper surface of the gate electrode film 11.

Figure 44:
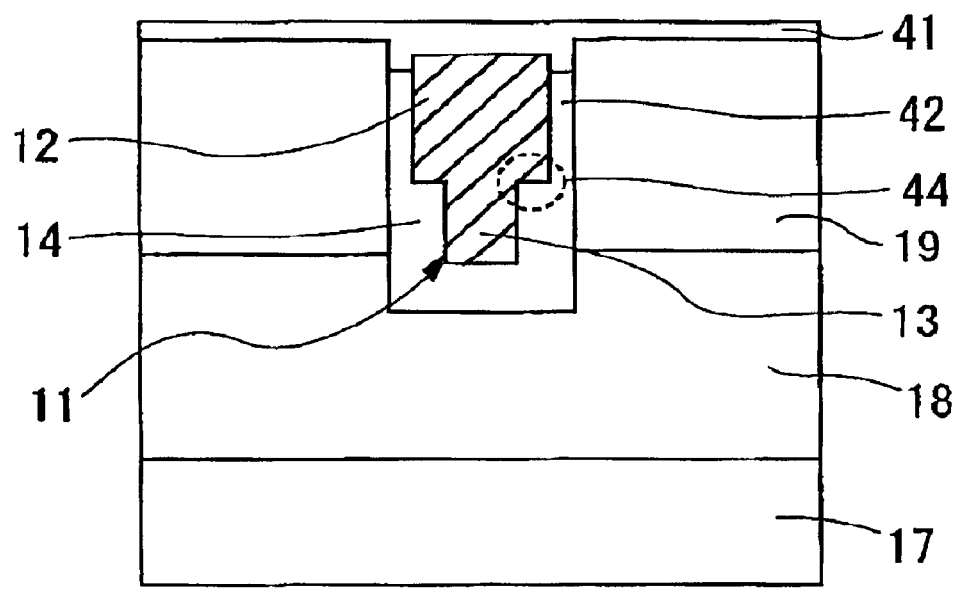
FIG. 44 is a cross-sectional view (view (r)) illustrating a manufacturing process of a semiconductor device according to a second embodiment of the present invention.
Figure 45:
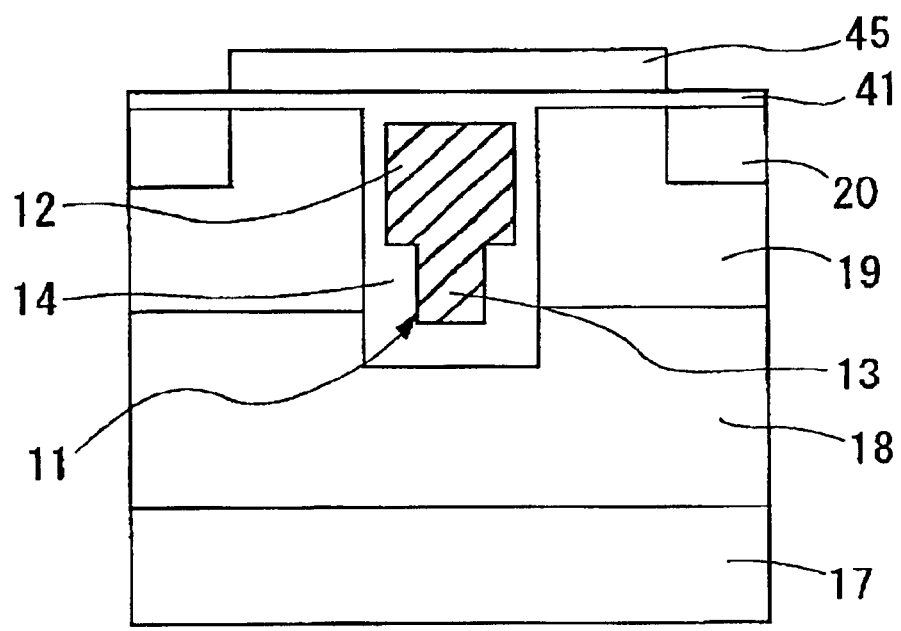
FIG. 45 is a cross-sectional view (view (s)) illustrating a manufacturing process of a semiconductor device according to a second embodiment of the present invention.

After this, as shown in FIG. 44, a thermal oxidizing process is performed so that a silicon oxide film 41 is formed on the N⁻ epitaxial layer 18, the gate electrode film 11, and the silicon oxide film 42. Boron ions (B⁺) are implanted into and dispsressed within the N⁻ epitaxial layer 18 to form the P type body layer 19. At this point, the interface between the N⁻ epitaxial layer 18 and the P type body layer 19 is set so as to be at a deeper position than the stepped parts 44 of the trenches 10. Next, as shown in FIG. 45, a photoresist is applied to the entire surface of the silicon oxide film 41, with this then being exposed to light and developed so as to form the photoresist film 45. After this, the photoresist film 45 is used as a mask and boron ions (B⁺) are implanted into the P type body layer 19. After the photoresist film 45 has been removed, a heat treatment is performed so as to disperse the boron ions (B⁺) in the P type body layer 19, resulting in the formation of the P⁺ type diffused regions 20.

Figure 46:
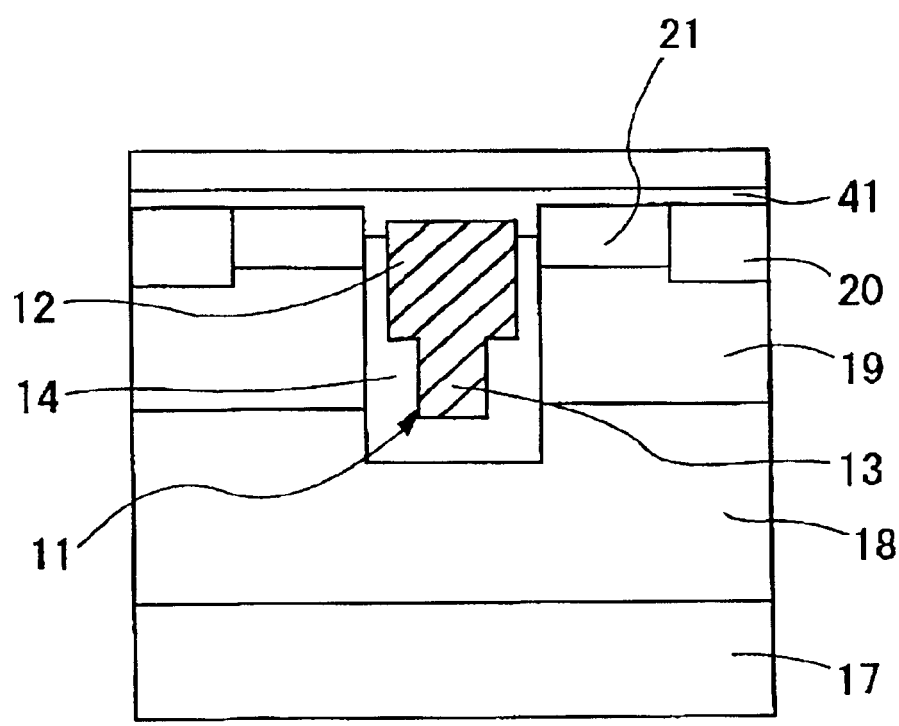
FIG. 46 is a cross-sectional view (view (t)) illustrating a manufacturing process of a semiconductor device according to a second embodiment of the present invention.
Figure 47:
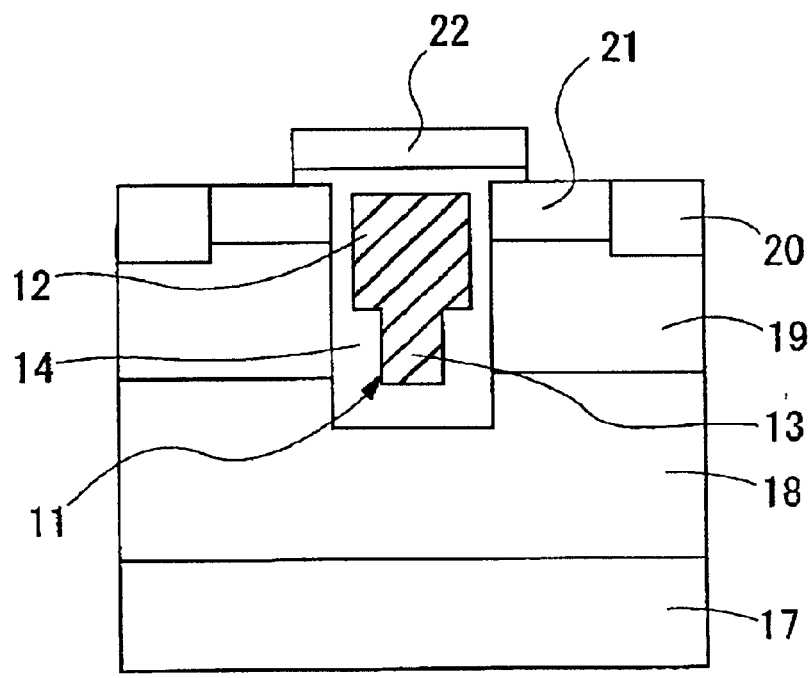
FIG. 47 is a cross-sectional view (view (u)) illustrating a manufacturing process of a semiconductor device according to a second embodiment of the present invention.

After this, a new photoresist is applied to form a photoresist film that is then exposed to light and developed. This photoresist film is used as mask and arsenic ions (As⁺) are implanted into the P type body layer 19. After this photoresist film has been removed, heat treatment is performed, resulting in the diffusion of the arsenic ions (As⁺) and the formation of the N⁺ type source regions 21. Next, as shown in FIG. 46, CVD is performed to deposit a Phospho-Silicate Glass (PSG) film on the entire surface of the silicon oxide film 41. After this, another photoresist is applied to form another photoresist film that is then exposed to light and developed. After this, as shown in FIG. 47, dry-etching is performed on the silicon oxide film 41 and the PSG film with the photoresist film as a mask, so that only the parts of the silicon oxide film 41 and the PSG film that cover the trenches 10 or are peripheral to the trenches 10 are left. The remaining parts of the PSG film form the interlayer dielectric 22.

Figure 48:
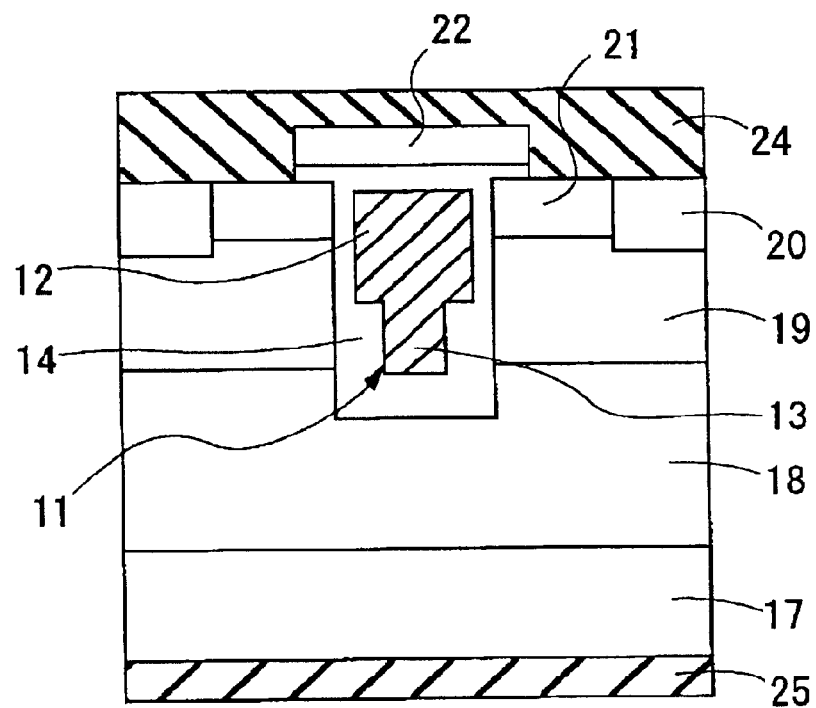
FIG. 48 is a cross-sectional view (view (v)) illustrating a manufacturing process of a semiconductor device according to a second embodiment of the present invention.

Finally, as shown in FIG. 48, aluminum is sputtered onto the surfaces of the interlayer dielectric 22 and the P type body layer 19 so as to form an aluminum film. A photoresist is then applied, exposed to light and developed. Unnecessary parts (not shown in the drawing) are then removed by dry-etching to form a source electrode film 24. Also, a drain electrode film 25 is formed on the rear surface of the N⁺ type silicon substrate 17 by forming a metal thin film using vapor deposition.

With the above manufacturing process, it is easy to form a gate electrode film 11 whose upper parts and lower parts have different thicknesses. It should be noted that while the N⁻ epitaxial layer 18 is produced in the above process through an epitaxial growth, the N⁻ epitaxial layer 18 may be formed by a surface diffusion method. Also, while the source electrode film 24 is described as being formed of aluminum, a different metal, such as copper, may be used.

(Third Embodiment)

Figure 49:
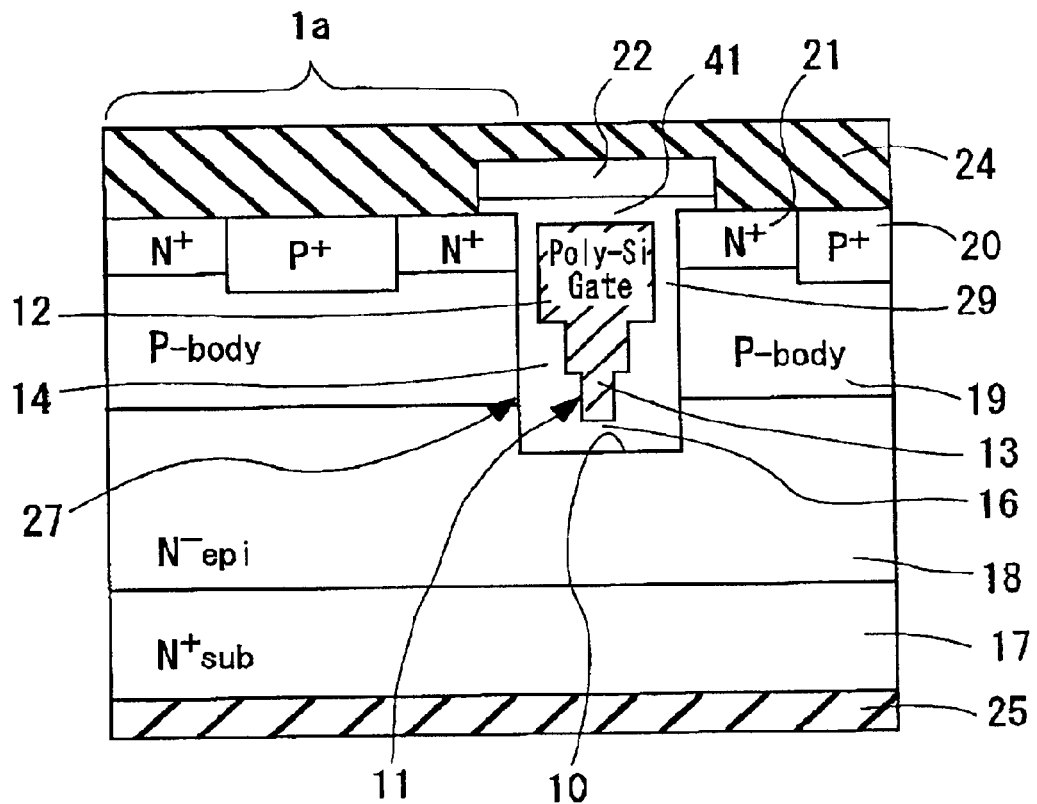
FIG. 49 is a cross-sectional view of a semiconductor device according to the third embodiment of the present invention.

The gate electrode film 11 was described as being formed with stepped sides so that there are two parts with different thicknesses, though the gate electrode film 11 may be formed with a higher number of parts with different thicknesses. FIG. 49 is a cross-sectional drawing showing a semiconductor device according to a third embodiment of the present invention. The numerals used in FIG. 49 are the same as those used in FIG. 1. As shown in FIG. 49, the semiconductor device according to the third embodiment of the present invention has a gate electrode film 11 that has three vertically arranged parts with different thicknesses.

(Forth Embodiment)

Figure 50:
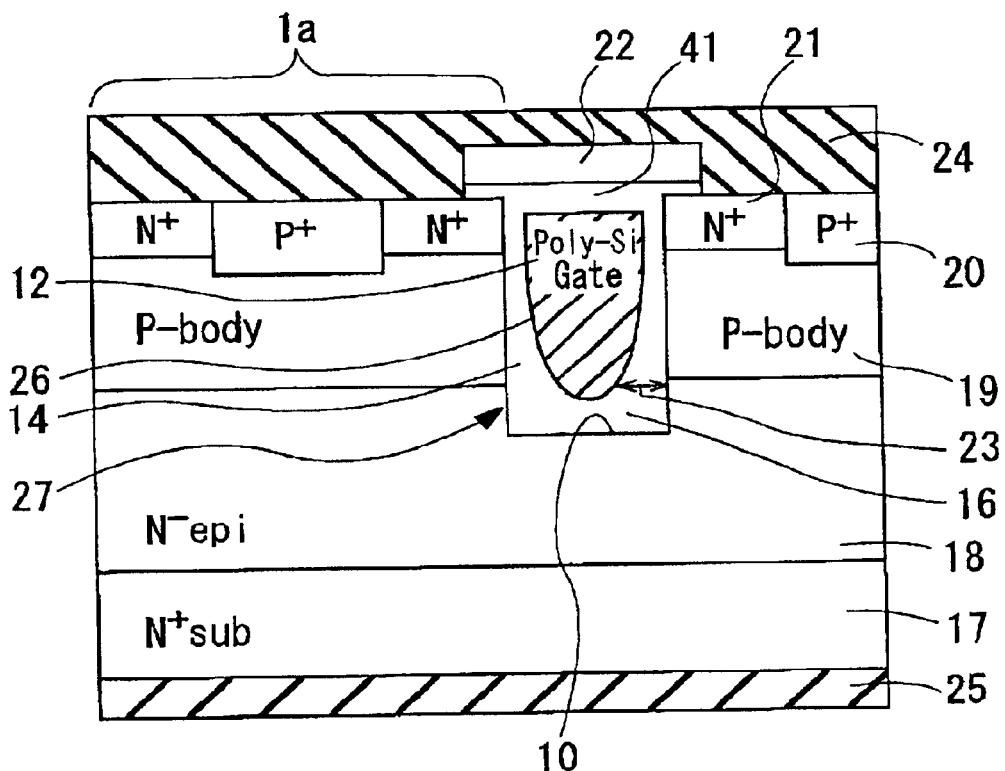
FIG. 50 is a cross-sectional view of a semiconductor device according to the fourth embodiment of the present invention.
Figure 51A:
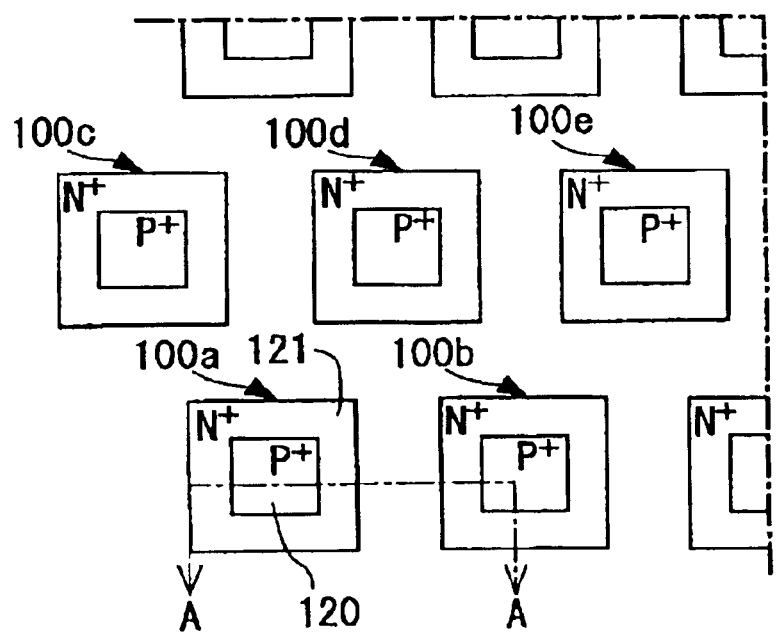
FIGS. 51A and 51B show an example of a trench gate power MOSFET-type semiconductor device according to the background art, with FIG. 51A being an overhead view of the semiconductor device and FIG. 51B being a cross-sectional view taken along the line A—A.
Figure 51B:
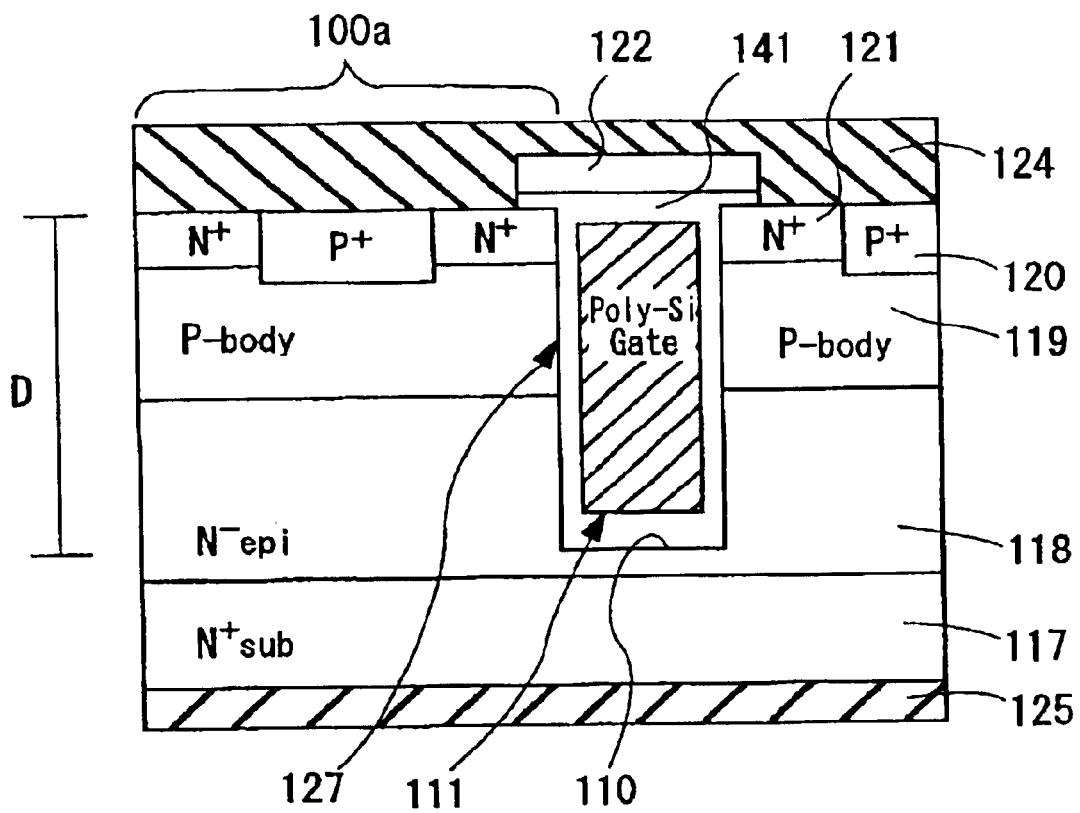

The following is a detailed description, with reference to the drawings, of a fourth embodiment of the present invention. FIG. 50 is a cross-sectional drawing showing a semiconductor device according to a fourth embodiment of the present invention. In FIG. 50, numeral 23 is the distance between the surface of the gate electrode film and the side surfaces of the trenches, while numeral 26 is the surface of the gate electrode film. The other numerals used in FIG. 50 are the same as those used in FIG. 1. As shown in FIG. 50, the semiconductor device according to the fourth embodiment of the present invention has a gate electrode film 11 with a surface 26 formed as a curved surface, so that the distance 23 between the surface of the gate electrode film and the side surfaces of the trenches continuously changes along the depth of the trenches 10.

As an alternative to the form described above, the gate electrode film can be made with the upper parts having a fixed thickness and the lower parts having a thickness that gradually decreases towards the bottom. As another alternative, the lower parts of the gate electrode film can have a fixed thickness with the upper parts of the gate electrode film having a thickness that gradually decreases towards the bottoms of the upper parts. Also, while each embodiment of the present invention is described using an example composed of an N-channel trench gate power MOSFET, the invention can be used in the same way in a P-channel trench gate power MOSFET. The present invention is also not restricted to a trench gate power MOSFET, and can be favorably applied to a semiconductor device with an insulated gate bipolar transistor (IGBT) construction.

According to the present invention as described above, the lower tip of the gate electrode film is positioned so as to be deeper than the source region but shallower than an interface between the drain layer and the conductive region. This makes it possible to reduce the capacitance between the gate electrode film and the drain layer while keeping the On resistance low and the withstand voltage of the gate insulating film at a sufficient level.

What is claimed is:

1. A semiconductor device, comprising:
   a semiconductor substrate, in which a drain layer of a first conductivity type and a conductive region of a second conductivity type opposite to the first conductivity type are formed with the conductive region over the drain layer;
   a trench formed in the conductive region, wherein said trench reaches the drain layer;
   a source region of the first conductivity type, wherein said source region is positioned inside the conductive region, with at least part of the source region being exposed to inner surfaces of the trench;
   a gate insulating film that is formed on the inner surfaces of the trench;
   a gate electrode that is formed on inner surfaces of the gate insulating film; and
   a source electrode that is insulated from the gate electrode and is connected to the source region;
   wherein the inner surface of the gate insulating film at a bottom of the trench is deeper than the source region but shallower than an interface between the drain layer and the conductive region.

2. A semiconductor device, comprising:
   a semiconductor substrate, in which a drain layer of a first conductivity type and a conductive region of a second conductivity type opposite to the first conductivity type are formed with the conductive region over the drain layer;
   a trench formed in the conductive region, wherein said trench reaches the drain layer but does not extend through an entire thickness of said drain layer;

a source region of the first conductivity type, wherein said source region is positioned inside the conductive region, with at least part of the source region being exposed to inner surfaces of the trench;

a gate insulating film that is formed on the inner surfaces of the trench so that parts of the gate insulating film that are located beyond a predetermined depth are thicker than other parts of the gate insulating film;

a gate electrode that is formed on inner surfaces of the gate insulating film; and a source electrode that is insulated from the gate electrode and is connected to the source region;

wherein the predetermined depth is in a range that is deeper than the source region but is shallower than an interface between the drain layer and the conductive region.

3. The semiconductor device according to claim 2, wherein a depth of said trench in the conductive region is greater than in the drain layer.

4. The semiconductor device according to claim 3, wherein, in the conductive region and the drain layer, said gate electrode has first and second dimensions measured in a thickness direction of said trench, respectively, and the first dimension is greater than the second dimension.

5. A semiconductor device, comprising:

a semiconductor substrate, in which a drain layer of a first conductivity type and a conductive region of a second conductivity type opposite to the first conductivity type are formed with the conductive region over the drain layer;

a trench formed in the conductive region, wherein said trench reaches the drain layer;

a source region of the first conductivity type, wherein said source region is positioned inside the conductive region, with at least part of the source region being exposed to inner surfaces of the trench;

a gate insulating film that is formed on the inner surfaces of the trench, wherein a thickness of the gate insulating film decreases towards the source region;

a gate electrode that is formed on inner surfaces of the gate insulating film; and a source electrode that is insulated from the gate electrode and is connected to the source region;

wherein the gate electrode has a curved surface facing the gate insulating film; and wherein a depth of said trench in the conductive region is greater than in the drain layer.

6. The semiconductor device according to claim 5, wherein, in the conductive region and the drain layer, said gate electrode has first and second dimensions measured in a thickness direction of said trench, respectively, and the first dimension is greater than the second dimension.

7. A semiconductor device, comprising:

a substrate;

an epitaxial layer of a first conductivity type formed on top of said substrate;

a body layer of a second conductivity type opposite to the first conductivity type formed on top of said epitaxial layer;

a trench formed in the body layer, wherein said trench reaches the epitaxial layer;

a source region of the first conductivity type formed on said body layer, with at least part of the source region being exposed to inner surfaces of the trench;

a gate insulating film that is formed on the inner surfaces of the trench;

a gate electrode that is formed within said trench and electrically isolated from said epitaxial layer, said body layer and said source region by the gate insulating film; and a source electrode that is insulated from the gate electrode and connected to the source region;

wherein a lowermost end face of said gate electrode is spaced from a first interface between the body layer and the epitaxial layer and a second interface between the epitaxial layer and the substrate by first and second distances, respectively, said distances being measured in a thickness direction of said trench, and the first distance is smaller than the second distance; and wherein the gate electrode ends at a level above the interface between the body layer and the epitaxial layer.

8. A semiconductor device, comprising:

a substrate;

an epitaxial layer of a first conductivity type formed on top of said substrate;

a body layer of a second conductivity type opposite to the first conductivity type formed on top of said epitaxial layer;

a trench formed in the body layer, wherein said trench reaches the epitaxial layer;

a source region of the first conductivity type formed on said body layer, with at least part of the source region being exposed to inner surfaces of the trench;

a gate insulating film that is formed on the inner surfaces of the trench;

a gate electrode that is formed within said trench and electrically isolated from said epitaxial layer, said body layer and said source region by the gate insulating film; and a source electrode that is insulated from the gate electrode and connected to the source region;

wherein a lowermost end face of said gate electrode is spaced from a first interface between the body layer and the epitaxial layer and a second interface between the epitaxial layer and the substrate by first and second distances, respectively, said distances being measured in a thickness direction of said trench, and the first distance is smaller than the second distance;

wherein a width of the gate electrode, as measured in a direction perpendicular to a thickness direction of said trench, increases towards the source region; and wherein the gate electrode has a step-wise profile.

9. A semiconductor device, comprising:

a substrate;

an epitaxial layer of a first conductivity type formed on top of said substrate;

a body layer of a second conductivity type opposite to the first conductivity type formed on top of said epitaxial layer;

a trench formed in the body layer, wherein said trench reaches the epitaxial layer;

a source region of the first conductivity type formed on said body layer, with at least part of the source region being exposed to inner surfaces of the trench;

a gate insulating film that is formed on the inner surfaces of the trench;

a gate electrode that is formed within said trench and electrically isolated from said epitaxial layer, said body layer and said source region by the gate insulating film; and a source electrode that is insulated from the gate electrode and connected to the source region;

wherein a lowermost end face of said gate electrode is spaced from a first interface between the body layer and the epitaxial layer and a second interface between the epitaxial layer and the substrate by first and second distances, respectively, said distances being measured in a thickness direction of said trench, and the first distance is smaller than the second distance;

wherein a width of the gate electrode, as measured in a direction perpendicular to a thickness direction of said trench, increases towards the source region; and wherein a depth of said trench in the body layer is greater than in the epitaxial layer.

10. The semiconductor device according to claim 9, wherein the trench does not extend into the substrate.

11. A semiconductor device, comprising:

a substrate;

an epitaxial layer of a first conductivity type formed on top of said substrate;

a body layer of a second conductivity type opposite to the first conductivity type formed on top of said epitaxial layer;

a trench formed in the body layer, wherein said trench reaches the epitaxial layer;

a source region of the first conductivity type formed on said body layer, with at least part of the source region being exposed to inner surfaces of the trench;

a gate insulating film that is formed on the inner surfaces of the trench;

a gate electrode that is formed within said trench and electrically isolated from said epitaxial layer, said body layer and said source region by the gate insulating film; and a source electrode that is insulated from the gate electrode and connected to the source region;

wherein a lowermost end face of said gate electrode is spaced from a first interface between the body layer and the epitaxial layer and a second interface between the epitaxial layer and the substrate by first and second distances, respectively, said distances being measured in a thickness direction of said trench, and the first distance is smaller than the second distance; and wherein a depth of said trench in the body layer is greater than in the epitaxial layer.

12. The semiconductor device according to claim 11, wherein the trench does not extend into the substrate.

\* \* \* \* \*